United States Patent
Ryu et al.

(10) Patent No.: US 9,676,047 B2
(45) Date of Patent: Jun. 13, 2017

(54) METHOD OF FORMING METAL BONDING LAYER AND METHOD OF MANUFACTURING SEMICONDUCTOR LIGHT EMITTING DEVICE USING THE SAME

(71) Applicant: SAMSUNG ELECTRONICS CO., LTD., Suwon-si, Gyeonggi-do (KR)

(72) Inventors: Yung Ho Ryu, Suwon-si (KR); Seung Woo Choi, Seoul (KR); Tae Hun Kim, Anyang-si (KR); Gyeong Seon Park, Seoul (KR); Jong Hoon Lim, Suwon-si (KR); Sung Joon Kim, Suwon-si (KR); Myong Soo Cho, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/569,402

(22) Filed: Dec. 12, 2014

(65) Prior Publication Data
US 2015/0099316 A1   Apr. 9, 2015

Related U.S. Application Data

(63) Continuation-in-part of application No. 14/207,466, filed on Mar. 12, 2014, now abandoned.

(30) Foreign Application Priority Data

Mar. 15, 2013   (KR) .................... 10-2013-0028185
Mar. 13, 2014   (KR) .................... 10-2014-0029669

(51) Int. Cl.
H01L 33/62   (2010.01)
B23K 1/20   (2006.01)
(Continued)

(52) U.S. Cl.
CPC .............. *B23K 1/0016* (2013.01); *B23K 1/20* (2013.01); *B23K 20/026* (2013.01); *B23K 20/16* (2013.01);
(Continued)

(58) Field of Classification Search
CPC ...................................... H01L 21/49
See application file for complete search history.

(56) References Cited

U.S. PATENT DOCUMENTS 6,372,608 B1   4/2002   Shimoda et al.
6,645,830 B2   11/2003   Shimoda et al.
(Continued)

FOREIGN PATENT DOCUMENTS

JP   2007-258647 A   10/2007
JP   2009-076611 A   4/2009
(Continued)

OTHER PUBLICATIONS

Office Action issued in related U.S. Appl. No. 14/207,466, mailed on Jun. 29, 2015, 13 pages.

*Primary Examiner* — Alexander Ghyka
(74) *Attorney, Agent, or Firm* — Lee & Morse, P.C.

(57) ABSTRACT

A method of forming a metal bonding layer includes forming first and second bonding metal layers on one surfaces of first and second bonding objects, respectively. The second bonding object is disposed on the first bonding object such that the first bonding metal layer and the second bonding metal layer face each other. A eutectic metal bonding layer is formed through a reaction between the first and second bonding metal layers. At least one of the first bonding metal layer and the second bonding metal layer includes an oxidation prevention layer formed on an upper surface thereof. The oxidation prevention layer is formed of a metal having an oxidation reactivity lower than an oxidation
(Continued)

reactivity of the bonding metal layer on the upper surface which the oxidation prevention layer is disposed.

16 Claims, 17 Drawing Sheets

(51) Int. Cl.
*B23K 1/00* (2006.01)
*B23K 35/26* (2006.01)
*B23K 35/28* (2006.01)
*B23K 35/30* (2006.01)
*B23K 35/32* (2006.01)
*B23K 35/02* (2006.01)
*H01L 23/00* (2006.01)
*H01L 33/00* (2010.01)
*B23K 20/02* (2006.01)
*B23K 20/16* (2006.01)
*B23K 20/233* (2006.01)
*B23K 101/40* (2006.01)
*B23K 101/42* (2006.01)

(52) U.S. Cl.
CPC ........ *B23K 20/233* (2013.01); *B23K 35/0238* (2013.01); *B23K 35/0261* (2013.01); *B23K 35/0272* (2013.01); *B23K 35/262* (2013.01); *B23K 35/264* (2013.01); *B23K 35/268* (2013.01); *B23K 35/282* (2013.01); *B23K 35/302* (2013.01); *B23K 35/3013* (2013.01); *B23K 35/3033* (2013.01); *B23K 35/3046* (2013.01); *B23K 35/32* (2013.01); *B23K 35/322* (2013.01); *H01L 24/29* (2013.01); *H01L 24/83* (2013.01); *H01L 33/0079* (2013.01); *B23K 2201/40* (2013.01); *B23K 2201/42* (2013.01); *H01L 2224/83193* (2013.01); *H01L 2924/01322* (2013.01); *H01L 2924/12042* (2013.01); *H01L 2933/0066* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,855,459 B2 | 12/2010 | Slater, Jr. et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,110,451 B2 | 2/2012 | Akaike et al. |
| 8,129,711 B2 | 3/2012 | Kang et al. |
| 8,179,938 B2 | 5/2012 | Kim |
| 8,222,663 B2 | 7/2012 | Kim et al. |
| 8,236,687 B2 | 8/2012 | Lin et al. |
| 8,263,987 B2 | 9/2012 | Choi et al. |
| 8,288,868 B2 | 10/2012 | Seko |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0210971 A1 | 9/2008 | Donofrio et al. |
| 2008/0246164 A1 | 10/2008 | Ueshima |
| 2009/0050920 A1 | 2/2009 | Nakamura et al. |
| 2009/0223830 A1 | 9/2009 | Tsujimoto et al. |
| 2012/0168954 A1 | 7/2012 | Seko |

FOREIGN PATENT DOCUMENTS

| | | |
|---|---|---|
| JP | 2009-188176 A | 8/2009 |
| JP | 2012-142320 A | 7/2012 |
| KR | 10-2009-0053309 A | 5/2009 |
| KR | 10-1165993 B1 | 7/2012 |
| KR | 10-2012-0131292 A | 12/2012 |
| WO | 2009/066825 A1 | 5/2009 |

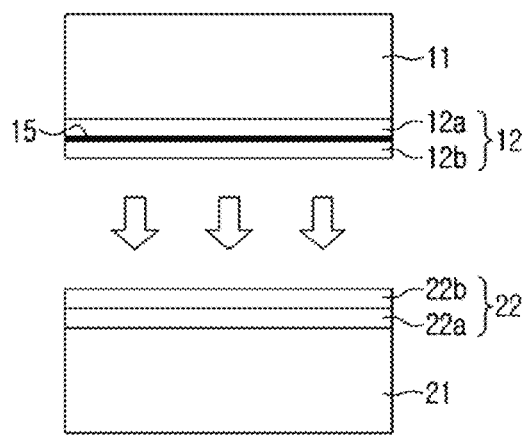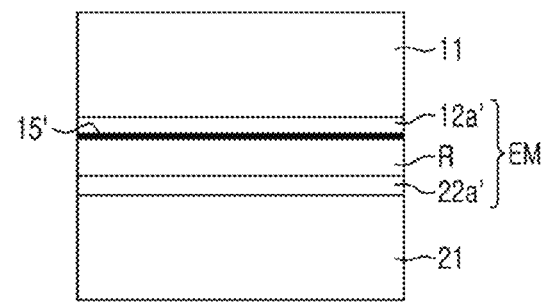
FIG. 1A
FIG. 1B
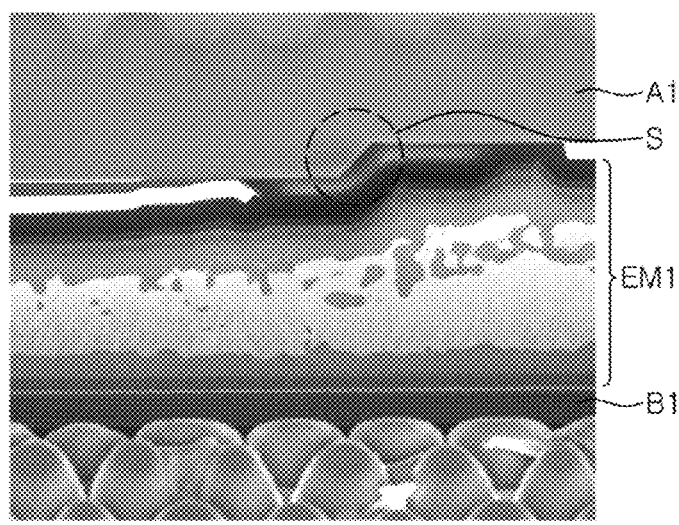
FIG. 2

METHOD OF FORMING METAL BONDING LAYER AND METHOD OF MANUFACTURING SEMICONDUCTOR LIGHT EMITTING DEVICE USING THE SAME

CROSS-REFERENCE TO RELATED APPLICATION

This application is a Continuation-In-Part of U.S. application Ser. No. 14/207,466 filed Mar. 12, 2014, which claims benefit of priority to Korean Patent Application No. 10-2014-0029669 filed on Mar. 13, 2014, which claims benefit of priority to Korean Patent Application No. 10-2013-0028185 filed on Mar. 15, 2013 with the Korean Intellectual Property Office, the entire contents of which are incorporated herein by reference.

TECHNICAL FIELD

The present disclosure relates to a method of forming a metal bonding layer and a method of manufacturing a semiconductor light emitting device using the same.

BACKGROUND

In general, methods of bonding an object such as an electronic device to another object such as a base member, using a bonding metal are in widespread use. In particular, in the case of transferring an electronic device such as a semiconductor light emitting device after the manufacturing thereof, to another substrate, various bonding technologies using eutectic metals are employed in order to transfer the electronic device to a permanent substrate.

However, defects such as undesirable voids may be caused in a eutectic metal bonding layer formed through a reaction between bonding metals, such that bonding strength may be deteriorated. In particular, such defects may easily occur when a bonding surface is a non-flat surface, thereby significantly causing defective bonding between objects.

In addition, even after bonding the objects using a bonding metal, the objects may come separated from each other depending on a surface state of the bonding metal.

SUMMARY

An aspect of the present disclosure provides a method of forming a metal bonding layer having improved bonding strength and reliability by suppressing factors hindering stable bonding between bonding objects, such as voids generated at the time of bonding the objects, and a method of manufacturing a semiconductor light emitting device using the same.

One aspect of the present disclosure relates to a method of forming a metal bonding layer including forming first and second bonding metal layers on one surfaces of first and second bonding objects, respectively. The second bonding object is disposed on the first bonding object such that the first bonding metal layer and the second bonding metal layer face each other. A eutectic metal bonding layer is formed through a reaction between the first and second bonding metal layers. At least one of the first bonding metal layer and the second bonding metal layer includes an oxidation prevention layer formed on an upper surface thereof, the oxidation prevention layer being formed of a metal having an oxidation reactivity lower than an oxidation reactivity of the corresponding bonding metal layer on the upper surface of which the oxidation prevention layer is disposed.

The at least one of the first bonding metal layer and the second bonding metal layer may contain a metal selected from tin (Sn), indium (In), zinc (Zn), bismuth (Bi), lead (Pb), nickel (Ni), gold (Au), platinum (Pt), copper (Cu), cobalt (Co), or an alloy thereof.

The oxidation prevention layer may be formed of a material different from a material of the bonding metal layer on the upper surface of which the oxidation prevention layer is disposed. The oxidation prevention layer may contain a metal selected from palladium (Pd), platinum (Pt), ruthenium (Ru), rhodium (Rh), silver (Ag), osmium (Os), iridium (Ir), gold (Au) or an alloy thereof. The oxidation prevention layer may have a thickness of 10 Å to 100 Å.

The at least one of the first bonding metal layer and the second bonding metal layer may further include a reaction delay layer formed of a metal or an alloy thereof for delaying a reaction between the first and second bonding metal layers.

The reaction delay layer may contain a metal selected from titanium (Ti), tungsten (W), chromium (Cr), tantalum (Ta), or an alloy thereof.

The at least one of the first bonding metal layer and the second bonding metal layer may include a first reaction layer formed on one surface of the first or second bonding object and containing at least one metal of Ni, Pt, Au, Cu and Co, and a second reaction layer formed on the first reaction layer, so as to react with the metal of the first reaction layer to provide a eutectic metal, and containing a metal selected from Sn, In, Zn, Bi, Au, Co or an alloy thereof.

The at least one of the first bonding metal layer and the second bonding metal layer may further include a reaction delay layer positioned between the first reaction layer and the second reaction layer and containing a metal selected from Ti, W, Cr, Ta or an alloy thereof.

Another aspect of the present disclosure encompasses a method of manufacturing a semiconductor light emitting device including preparing a light emitting laminate in which a first conductivity type semiconductor layer, an active layer, and a second conductivity type semiconductor layer are sequentially formed on a semiconductor growth substrate. A first bonding metal layer is formed on the light emitting laminate and a second bonding metal layer is formed on a permanent substrate. The light emitting laminate is disposed on the permanent substrate such that the first bonding metal layer and the second bonding metal layer come into contact with each other. A eutectic metal bonding layer is formed through a reaction between the first bonding metal layer and the second bonding metal layer to bond the light emitting laminate and the permanent substrate to each other. At least one of the first bonding metal layer and the second bonding metal layer includes an oxidation prevention layer formed on an upper surface thereof. The oxidation prevention layer is formed of a metal having an oxidation reactivity lower than an oxidation reactivity of the bonding metal layer on the upper surface of which the oxidation prevention layer is disposed.

The at least one of the first bonding metal layer and the second bonding metal layer may further include a reaction delay layer formed of a metal or an alloy thereof for delaying the reaction between the first and second bonding metal layers.

Still another aspect of the present disclosure relates to a method of forming a metal bonding layer, including forming, on a surface of a first bonding object, a first bonding metal layer including a first reaction layer, a second reaction layer, and a reaction delay layer interposed between the first and second reaction layers, so as to delay a reaction between the first reaction layer and the second reaction layer. On a surface of a second bonding object, a second bonding metal layer is formed including a first reaction layer and a second reaction layer. The second bonding object is disposed on the first bonding object such that the first bonding metal layer and the second bonding metal layer face each other. Heat is applied to the first and second bonding metal layers, so as to form a eutectic metal bonding layer.

In the forming of the second bonding metal layer, a reaction delay layer may be formed between the first and second reaction layers of the second bonding metal layer so as to delay a reaction between the first and second reaction layers of the second bonding metal layer.

At least one of the second reaction layer of the first bonding metal layer and the second reaction layer of the second bonding metal layer may have a double layer structure.

At least one of the first bonding metal layer and the second bonding metal layer may include an oxidation prevention layer disposed on an upper surface thereof.

The oxidation prevention layer may be formed of a metal having an oxidation reactivity lower than an oxidation reactivity of the bonding metal layer on the upper surface of which the oxidation prevention layer is disposed.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

FIGS. 1A and 1B are process cross-sectional views illustrating a method of forming a metal bonding layer according to an exemplary embodiment of the present inventive concept.

FIGS. 2 and 3 are images obtained by imaging cross-sections of metal bonding layers formed according to Inventive Example 1 and Comparative Example, respectively.

DETAILED DESCRIPTION

Figure 3:
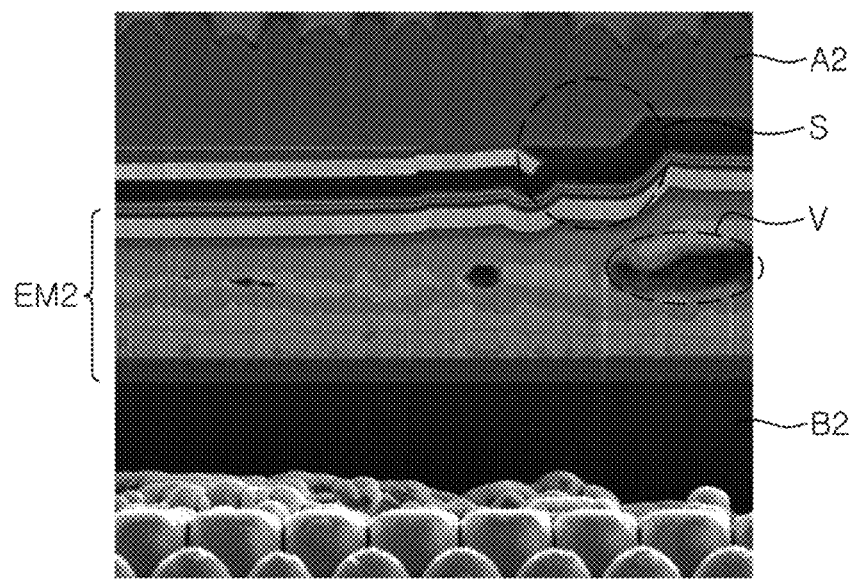

Hereinafter, exemplary embodiments of the present inventive concept will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIGS. 1A and 1B are process cross-sectional views illustrating a method of forming a metal bonding layer according to an exemplary embodiment of the present inventive concept.

FIG. 1A illustrates, as bonding objects, a first substrate 11 having one surface on which a first bonding metal layer 12 is formed, and a second substrate 21 having one surface on which a second bonding metal layer 22 is formed.

Although the bonding objects are exemplified as substrates in the exemplary embodiment of FIG. 1A, examples of the bonding objects may include boards equipped with electronic circuits in order to perform certain functions, as well as electronic devices, such as semiconductor light emitting devices and memory devices, in addition to substrates serving as simple members.

The respective first and second bonding metal layers 12 and 22 may contain a metal (including an alloy) selected from tin (Sn), indium (In), zinc (Zn), bismuth (Bi), lead (Pb), nickel (Ni), gold (Au), platinum (Pt), copper (Cu), cobalt (Co) or an alloy thereof.

By way of example, as illustrated in FIG. 1A, the first bonding metal layer 12 may include a first reaction layer 12a formed on one surface of the first substrate 11 and a second reaction layer 12b formed on the first reaction layer 12a. In a similar manner, the second bonding metal layer 22 may also include a first reaction layer 22a formed on one surface of the second substrate 21 and a second reaction layer 22b formed on the first reaction layer 22a.

Each of the first reaction layers 12a and 22a and the second reaction layers 12b and 22b may be formed of a single metal or two or more metals that react with each other to form a eutectic metal, or an alloy thereof. Although not limited hereto, the second reaction layers 12b and 22b may be formed of a metal or an alloy thereof having a relatively large diffusion coefficient as compared to the first reaction layers 12a and 22a, and the first reaction layers 12a and 22a may serve to maintain states of adhesion between the first and second substrates 11 and 12 and the first and second bonding metal layers 12 and 22, respectively.

For example, the first reaction layers 12a and 22a may contain at least one metal selected from Ni, Pt and Cu. The second reaction layers 12b and 22b may contain a metal selected from tin (Sn), indium (In), zinc (Zn), bismuth (Bi), gold (Au), cobalt (Co), or an alloy thereof.

In an exemplary embodiment of the present inventive concept, the first bonding metal layer 12 may include a reaction delay layer 15 between the first and second reaction layers 12a and 12b, the reaction delay layer 15 delaying a reaction generated in a bonding process, as illustrated in FIG. 1A. That is, the reaction delay layer 15 may serve to suppress fluidity that enables a metal melted during the bonding process in which the first and second reaction layers 12a and 12b are melted, to be transferred so as to react with another metal or alloy thereof. Such a reaction delay layer 15 may be formed of a metallic material having a relatively low diffusion coefficient as compared to a reaction material constituting the first and second bonding metal layers 12 and 22, and/or having high thermal or chemical stability as compared to surrounding reaction materials.

For example, the reaction delay layer 15 may contain a metal selected from Ti, W, Cr, Ta, or an alloy thereof. A thickness of the reaction delay layer 15 may be 10 Å to 1000 Å.

As illustrated in FIG. 1A, the second substrate 21 may be disposed on the first substrate 11 such that the first bonding metal layer 12 and the second bonding metal layer 22 face each other, and bonding conditions are applied thereto. For example, a predetermined degree of heat may be applied thereto in order to melt the first and second bonding metal layers 12 and 22.

FIG. 1B illustrates a state in which the first substrate 11 and the second substrate 21 are bonded to each other due to a eutectic metal bonding layer EM being formed by melting the first and second bonding metal layers 12 and 22.

In the melted state of the first and second bonding metal layers 12 and 22, the second reaction layers 12b and 22b may react with the first reaction layers 12a and 22a, while having a high degree of fluidity. Consequently, as illustrated in FIG. 1B, a eutectic metal layer R, a reaction product obtained through the reaction between the first reaction layers 12a and 22a and the second reaction layers 12b and 22b, may be formed, such that the eutectic metal bonding layer EM may have a high degree of adhesion strength. In certain cases, a portion of first reaction layers 12a' and 22a' may not be reacted and remain, and the remaining portion of the first reaction layers 12a' and 22a' may maintain adhesion thereof with respect to the first and second substrates 11 and 21, respectively.

In an exemplary embodiment of the present inventive concept, the reaction delay layer 15 may decrease fluidity of the second reaction layers 12b and 22b, such that the reaction between the first reaction layers 12a and 22a and the second reaction layers 12b and 22b may be delayed. The generation of voids in the eutectic metal reacted in such a delay process may be decreased, thereby allowing for a high filling rate.

In detail, melted Sn layer, SnAu layer and the like used as the second reaction layers 12b and 22b may react with other reaction layers (e.g., Ni layer, Pt layer or Cu layer) such as the first reaction layers 12a and 22a to thereby form the eutectic metal bonding layer such as NiSn, NiSnAu, PtSnAu or CuSn. In the reaction, fluidity of the melted Sn layer may be decreased. As a result, a sufficient time required for filling steps formed on a semiconductor layer or a bonding surface of the substrate with a Sn layer, a SnAu layer, a NiSn layer, a NiSnAu layer, a PtSnAu layer, and a CuSn layer may not be secured, such that voids may be formed on the semiconductor layer and the bonding surface of the substrate.

In order to solve such defects, the reaction delay layer (e.g., 15 in FIG. 1A and 15' in FIG. 1B) may be positioned between two reaction layers to delay reaction and consequently, fluidity may be maintained for a sufficient period of time, thereby suppressing the generation of voids.

Therefore, when bonding surfaces of the first and second substrates provided as bonding objects have non-flat surfaces (e.g., stepped structure or uneven surface), a high degree of filling may be secured due to the delay of reaction, such that the eutectic metal bonding layer EM having superior bonding strength may be obtained.

Hereinafter, operations and effects of the reaction delay layer employed in an exemplary embodiment of the present inventive concept will be described in detail with reference to the following Examples.

Inventive Example 1

A Ni layer and a SnAu layer (first bonding metal layer) serving as first and second reaction layers were formed on an epitaxial layer (on a wafer level) on which a GaN light emitting device A1 having a predetermined step S was formed, and in the same manner, a Ni layer and a SnAu layer (second bonding metal layer) serving as first and second reaction layers were formed on a silicon substrate B1. As a reaction delay layer, a Ti layer of 50 nm was provided between the Ni layer and the SnAu layer of the first bonding metal layer.

Subsequently, heat was applied such that the GaN light emitting device and the silicon substrate were bonded to each other by the first and second bonding metal layers, to thereby form a eutectic metal bonding layer EM1.

Comparative Example 1

Similarly to the foregoing Inventive Example 1, a Ni layer and a SnAu layer serving as first and second reaction layers of a first bonding metal layer were formed on an epitaxial layer on a wafer level of a GaN light emitting device A2 having a predetermined step S, and in the same manner, a Ni layer and a SnAu layer serving as first and second reaction layers of a second bonding metal layer were formed on a silicon substrate B2. However, unlike the Inventive Example 1, a reaction delay layer was not introduced therein.

Subsequently, heat was applied such that the GaN light emitting device and the silicon substrate were bonded to each other by the first and second bonding metal layers, to thereby form a eutectic metal bonding layer EM2.

FIGS. 2 and 3 are images obtained by imaging cross-sections of eutectic metal bonding layers formed according to the Inventive Example 1 and the Comparative Example 1.

As illustrated in FIG. 2, in the eutectic metal bonding layer EM1 according to the Inventive Example 1, a reacted region was locally indicated, and even though the GaN light emitting device A1 had the step S, voids were not found in the overall region of the bonding layer. On the other hand, as illustrated in FIG. 3, in the eutectic metal bonding layer EM2 according to the Comparative Example 1, a reacted region was relatively broad and in particular, a large void V occurred immediately below the step S of the GaN light emitting device A1.

That is, in the case of the Comparative Example 1, as a reaction between Ni and SnAu rapidly proceeded over a wide region, a non-flat surface such as the step S was not filled with Ni and SnAu, thereby causing the formation of voids V. On the other hand, in the case of the Inventive Example 1, the reaction between Ni and SnAu was delayed by the Ti reaction delay layer and accordingly, time required for filling even a non-flat surface such as the step S could be secured, while a high degree of fluidity was maintained. As a result, the generation of voids could be significantly suppressed.

Figure 4:
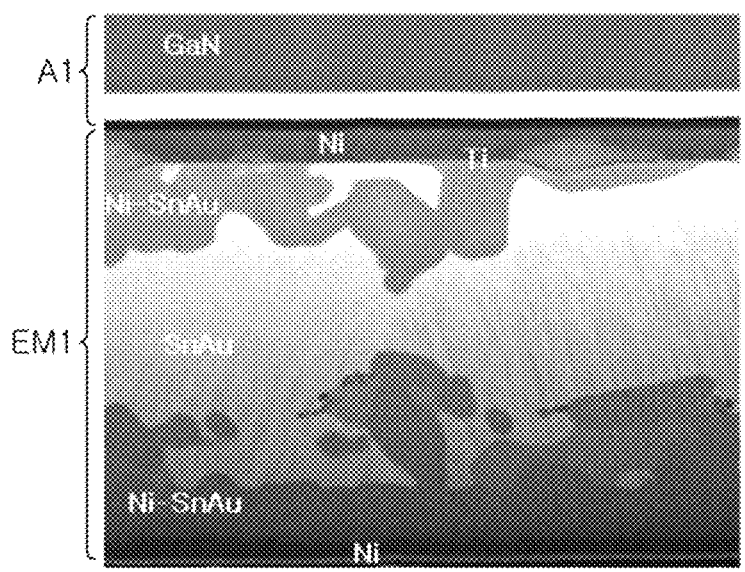
FIG. 4 is an image illustrating the distribution of reaction layers in the metal bonding layer obtained from Inventive Example 1.

In connection with this, referring to FIG. 4, in a region in which the Ti reaction delay layer is positioned, a relatively lower amount of NiSnAu eutectic metal as a reaction product was present. In this manner, the Ti reaction delay layer could suppress the reaction between Ni and SnAu to maintain fluidity for a relatively long time. As a result, voids were not generated even in an uneven portion of the GaN light emitting device A1, and the uneven portion could be uniformly filled.

As described above, even in the case of a bonding object having a non-flat surface such as a stepped structure, a reaction between bonding metal layers may be delayed using a reaction delay layer to increase a filling rate, whereby a eutectic metal bonding layer having high bonding strength may be provided.

Additionally, experiments (Inventive Example 2 and Comparative Example 2) were undertaken in order to determine effects obtainable from the delay of reaction, depending on a thickness of the reaction delay layer.

Inventive Examples 2A and 2B

Figure 5A:
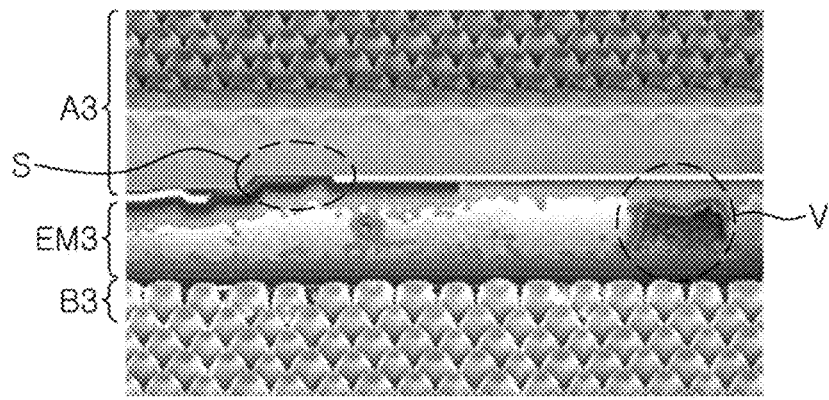
FIGS. 5A through 5C are images obtained by imaging cross-sections of a metal bonding layer formed according to Inventive Example 2 (change depending on a thickness of a reaction delay layer).
Figure 5B:
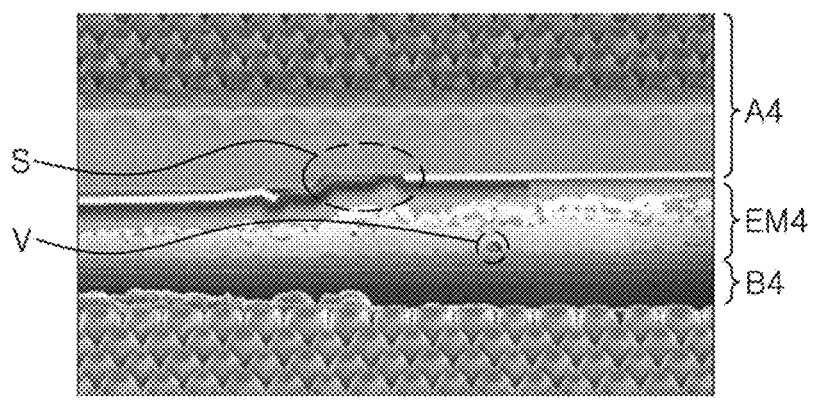
Figure 5C:
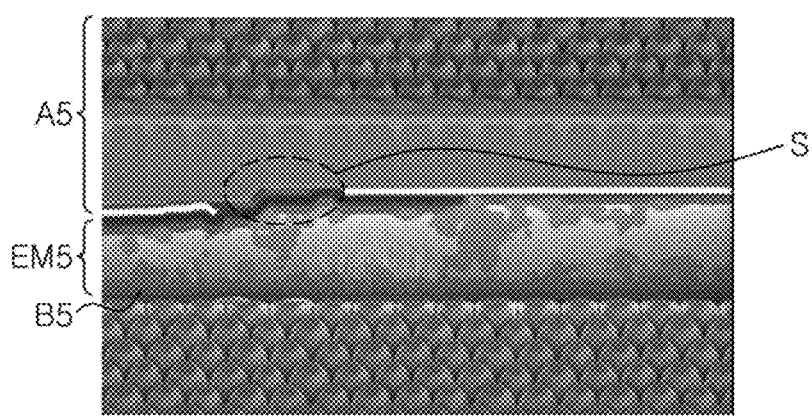

In a similar manner to the foregoing Inventive Example 1, referring to FIGS. 5B and 5C, a Ni layer and a SnAu layer serving as first and second reaction layers of a first bonding metal layer were formed on an epitaxial layer of each of GaN light emitting devices A4 and A5 having a predetermined step S, and in the same manner, a Ni layer and a SnAu layer serving as first and second reaction layers of a second bonding metal layer were formed on each of silicon substrates B4 and B5. As a reaction delay layer, a Ti layer was provided between the Ni layer and the SnAu layer of the first bonding metal layer.

Two samples 2A and 2B were manufactured by differentiating thicknesses of the Ti layer, 50 Å and 300 Å, respectively.

Subsequently, heat was applied such that the GaN light emitting devices and the silicon substrate were bonded to each other by the first and second bonding metal layers, to thereby form eutectic metal bonding layers EM4 and EM5 (see FIGS. 5B and 5C).

Comparative Example 2

Similarly to the foregoing Examples, referring to FIG. 5A, a Ni layer and a SnAu layer serving as first and second reaction layers of a first bonding metal layer were formed on an epitaxial layer of a GaN light emitting device A3 having a predetermined step S, and in the same manner, a Ni layer and a SnAu layer serving as first and second reaction layers of a second bonding metal layer were formed on a silicon substrate B3. However, in neither the first bonding metal layer nor the second bonding metal layer, was a Ti layer introduced.

Subsequently, heat was applied such that the GaN light emitting device and the silicon substrate were bonded to each other by the first and second bonding metal layers, to thereby form a eutectic metal bonding layer EM3 (see FIG. 5A).

FIGS. 5A through 5C are images obtained by imaging cross-sections of the eutectic metal bonding layers obtained according to Comparative Example 2 and Inventive Examples 2A and 2B.

As illustrated in FIG. 5A, in a case in which a Ti layer was not employed (Comparative Example 2), a large void was formed. Bonding strength was significantly deteriorated due to such a large void, thereby significantly degrading reliability of the device.

Meanwhile, in the case of a Ti layer having a thickness of 50 Å (Inventive Example 2A), as illustrated in FIG. 5B, a significantly smaller void V was merely found. In the case of a Ti layer having a thickness of 300 Å (Inventive Example 2B), as illustrated in FIG. 5C, no voids were found.

In such a manner, in accordance with an increase in the thickness of the Ti layer which is a reaction delay layer, a delay degree of reaction was increased and a filling rate could be further increased. However, in order to avoid a case in which the reaction delay is greatly increased or the reaction itself is suppressed, a thickness of the reaction delay layer may be controlled to be suitable for a bonding metal system. In consideration of this, the thickness of the Ti layer may not exceed 1000 Å. Meanwhile, to realize reaction delay effects, the Ti layer may have a thickness of at least 10 Å.

Hereinafter, various examples of bonding metal system performable using a reaction delay layer will be described. FIGS. 6 through 9 illustrate structures and compositions of bonding metal layers and structures of correspondingly obtainable eutectic metal bonding layers.

Figure 6:
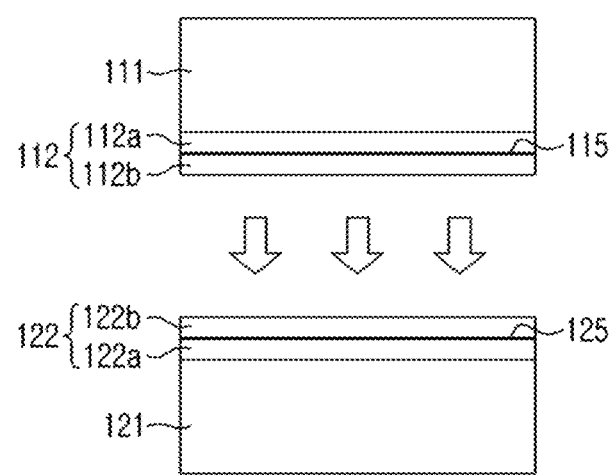
FIG. 6 is a cross-sectional view illustrating a eutectic metal layer used in the method of forming a metal bonding layer including a reaction delay layer according to an exemplary embodiment of the present inventive concept.

FIG. 6 illustrates, as bonding objects, a first substrate 111 having one surface on which a first bonding metal layer 112 is formed, and a second substrate 121 having one surface on which a second bonding metal layer 122 is formed.

The first bonding metal layer 112 may include a first reaction layer 112a formed on one surface of the first substrate 111 and a second reaction layer 112b formed on the first reaction layer 112a. In a similar manner, the second bonding metal layer 122 may also include a first reaction layer 122a formed on one surface of the second substrate 121 and a second reaction layer 122b formed on the first reaction layer 122a. Further, unlike the form of FIG. 1A, reaction delay layers 115 and 125 may be formed in both of the first and second bonding metal layers 112 and 122, respectively.

In an exemplary embodiment of the present inventive concept, the second reaction layers 112b and 122b may be formed of Sn or AuSn. In this case, the first reaction layers 112a and 122a may be formed of Ni. In addition to Ni, the first reaction layers 112a and 122a may be formed of Pt, Au, Cu or Co. The reaction delay layers 115 and 125 may all be Ti layers.

As described above, the reaction delay layers 115 and 125 formed of Ti may secure a sufficient degree of fluidity by delaying a reaction process undertaken in a bonding process. Consequently, a desired degree of filling rate may be secured and a bonding system having excellent reliability may be provided.

Figure 7A:
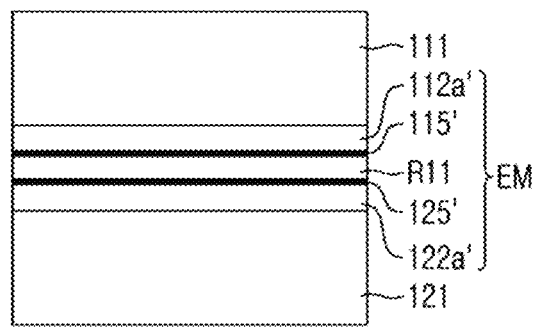
FIGS. 7A through 7C are cross-sectional views illustrating various examples of the metal bonding layer that may be formed through a reaction of bonding metal layers in accordance with FIG. 6.
Figure 7B:
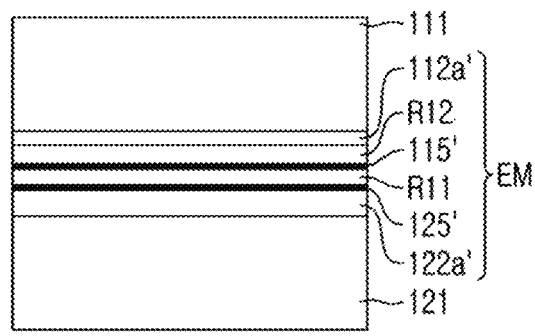
Figure 7C:
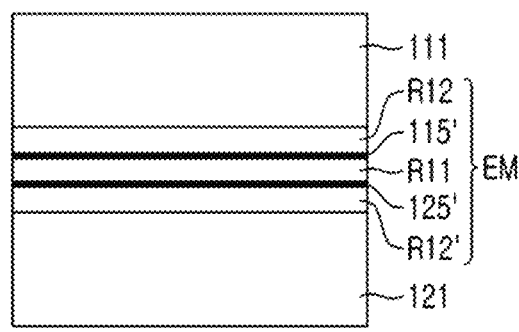

FIGS. 7A through 7C illustrate structures of eutectic metal bonding layers EM obtainable using the first and second bonding metal layers illustrated in FIG. 6.

As illustrated in FIG. 7A, a mixture layer R11 including a eutectic metal formed of NiSn or NiSn/Sn/NiSn (or NiSnAu in a case in which the first reaction layer is formed of AuSn) may be formed in a central region of the eutectic metal bonding layer EM, and Ti layers 115' and 125' may be formed as residues of the reaction delay layers 115 and 125 on periphery portions of the mixture layer R11. The remaining Ti layers 115' and 125' may be present in a slightly deformed state (bent or partially disconnected state) in the reaction process. A Ni layer 112a' may remain between the Ti layers 115' and the first substrate 111. A Ni layer 122a' may remain between the Ti layer 125' and the second substrate 121.

In another example, as illustrated in FIG. 7B, a first mixture layer R11 including a eutectic metal formed of NiSn or NiSn/Sn/NiSn (or NiSnAu in a case in which the first reaction layer is formed of AuSn) may be formed in a central region of the eutectic metal bonding layer EM, and Ti layers 115' and 125' may be formed on periphery portions of the first mixture layer R11. In addition, Sn contained in the mixture layer may be diffused over one Ti layer 115' to thereby form a second mixture layer R12 formed of NiSn or NiAuSn. Even in the bonding system according to an exemplary embodiment of the present inventive concept, Ni layers 112a' and 122a' may still remain on an interface between the first and second substrates 111 and 121.

As illustrated in FIG. 7C, in another example of the eutectic metal bonding layer EM, a first mixture layer R11 including a eutectic metal formed of NiSn or NiSn/Sn/NiSn (or NiSnAu in a case in which the first reaction layer is formed of AuSn) may be formed in a central region of the eutectic metal bonding layer EM, and Ti layers 115' and 125' may be formed on periphery portions of the first mixture layer R11. Unlike the foregoing examples, Ni layers may rarely remain on outer portions of the Ti layers 115' and 125' and may all be reacted to provide second mixture layers R12 and R12' formed of NiSn or NiAuSn.

In this manner, although the same bonding metal layers illustrated in FIG. 6 are used, various forms of bonding systems, the eutectic metal bonding layers EM as illustrated in FIGS. 7A through 7C may be formed depending on a bonding process actually used. Meanwhile, the eutectic metal bonding layers EM as illustrated in FIGS. 7A through 7C may be understood as being formed in a series of processes in which a reaction process proceeds in the order as illustrated in FIGS. 7A through 7C, together with diffusion.

Figure 8:
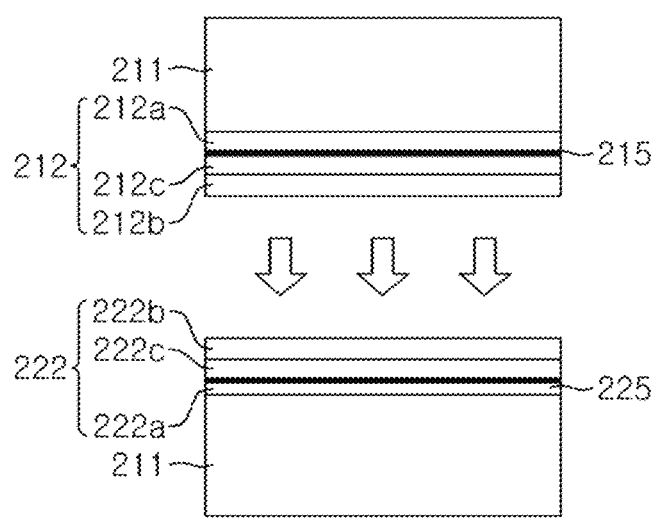
FIG. 8 is a cross-sectional view illustrating bonding metal layers used in the method of forming a metal bonding layer including a reaction delay layer according to an exemplary embodiment of the present inventive concept.

A structure having bonding metal layers according to another example is illustrated in FIG. 8. FIG. 8 illustrates, as bonding objects, a first substrate 211 having one surface on which a first bonding metal layer 212 is formed, and a second substrate 221 having one surface on which a second bonding metal layer 222 is formed.

The first bonding metal layer 212 may include a first reaction layer 212a formed on one surface of the first substrate 211, and second reaction layers 212b and 212c having a double layer structure and formed on the first reaction layer 212a. Similarly to this, the second bonding metal layer 222 may also include a first reaction layer 222a formed on one surface of the second substrate 221 and second reaction layers 222b and 222c having a double layer structure and formed on the first reaction layer 222a.

In an exemplary embodiment of the present inventive concept, the second reaction layers having the double layer structure may be an Au layer 212c or 222c and a Sn layer 212b or 222b.

Reaction delay layers 215 and 225 employed in an exemplary embodiment of the present inventive concept may be provided in both of the first and second bonding metal layers 212 and 222, respectively. The reaction delay layer 215 may be formed between the first reaction layer 212a and the Au layer 212c. The reaction delay layer 225 may be formed between the first reaction layer 222a and the Au layer 222c.

The first reaction layers 212a and 222a may be formed of Ni. In addition to Ni, the first reaction layers 212a and 222a may be formed of Pt, Au, Cu or Co. The reaction delay layers 215 and 225 may all be Ti layers. Also, the reaction delay layers 215 and 225 may be formed of W, Cr, Ta or a combination thereof, in addition to Ti.

FIGS. 9A through 9D illustrate structures of eutectic metal bonding layers EM obtained using the first and second bonding metal layers illustrated in FIG. 8.

Figure 9A:
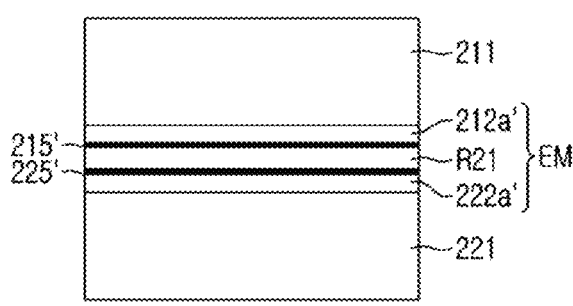
FIGS. 9A through 9D are cross-sectional views illustrating various examples of the metal bonding layer that may be formed through a reaction of the bonding metal layers in accordance with FIG. 8.

As illustrated in FIG. 9A, a mixture layer R21 including a eutectic metal formed of NiSnAu may be formed in a central region of the eutectic metal bonding layer EM, and Ti layers 215' and 225' may be formed on periphery portions of the mixture layer R21. The remaining Ti layers 215' and 225' may be present in a slightly deformed state (e.g., bent or partially disconnected state) in a reaction process. A Ni layer 212a' may remain between the Ti layer 215' and the first substrate 211. A Ni layer 222a' may remain between the Ti layer 225' and the second substrate 221.

Figure 9B:
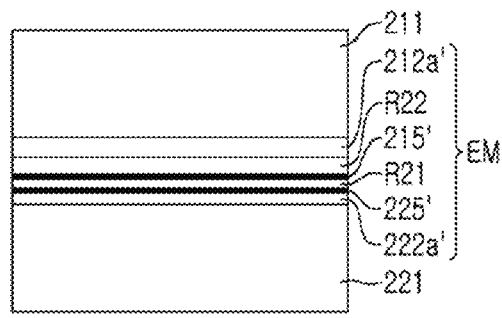

In another example, as illustrated in FIG. 9B, a first mixture layer R21 including a eutectic metal formed of NiSnAu may be formed in a central region of the eutectic metal bonding layer EM, and Ti layers 215' and 225' may remain on periphery portions of the first mixture layer R21. In addition, Sn contained in the mixture layer may be diffused over one Ti layer 215' to thereby form a second mixture layer R22 formed of NiSnAu. Even in the bonding system according to an exemplary embodiment of the present inventive concept, Ni layers 212a' and 222a' may still remain on an interface between the first and second substrates 211 and 221.

Figure 9C:
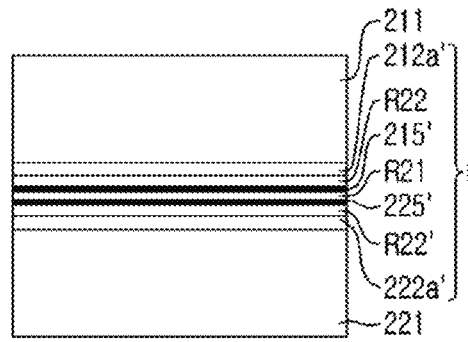

As illustrated in FIG. 9C, in another example of the eutectic metal bonding layer EM, a first mixture layer R21 including a eutectic metal formed of NiSnAu may be formed in a central region of the eutectic metal bonding layer EM. Ti layers 215' and 225' may remain on periphery portions of the first mixture layer R21 to form second mixture layers R22 and R22' formed of NiSnAu on outer portions of the Ti layers 215' and 225'. Even in the eutectic metal bonding layer EM according to an exemplary embodiment of the present inventive concept, Ni layers 212a' and 222a' may still remain on an interface between the first and second substrates 211 and 221.

Figure 9D:
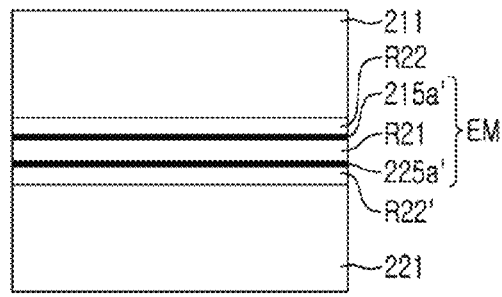

In another example of the eutectic metal bonding layer EM, as illustrated in FIG. 9D, a first mixture layer R21 including a eutectic metal formed of NiSnAu may be formed in a central region of the eutectic metal bonding layer EM. Ti layers 215a' and 225a' may be disposed on periphery portions of the first mixture layer R21, and Ni layers may rarely remain on outer portions of the Ti layers 215a' and 225a' and may all be reacted to provide second mixture layers R22 and R22' formed of NiSnAu.

In this manner, although the same bonding metal layers illustrated in FIG. 8 are used, various forms of bonding systems, the eutectic metal bonding layers EM as illustrated in FIGS. 9A through 9D may be formed depending on a bonding process actually used. Meanwhile, the eutectic metal bonding layers EM as illustrated in FIGS. 9A through 9D may be understood as being formed in a series of processes in which a reaction process proceeds in the order as illustrated in FIGS. 9A through 9D, together with diffusion.

In exemplary embodiments of the present inventive concept, unlike a structure of the second reaction layers described in FIG. 8, a stacking order of the Au layer and the Sn layer may be changed in a reversed manner. Even in the case of the change, metal bonding layers in a similar manner to metal bonding layers of the eutectic metal bonding layers EM illustrated in FIGS. 9A through 9D may be formed.

Various forms of the bonding systems as described above may be usefully employed in bonding an electronic device such as a semiconductor light emitting device to a substrate. FIGS. 10A through 10D illustrate a method of manufacturing a semiconductor light emitting device according to an exemplary embodiment of the present disclosure, using the eutectic metal bonding layer as described above.

FIGS. 10A through 10D are process cross-sectional views illustrating a method of manufacturing a semiconductor light emitting device according to an exemplary embodiment of the present disclosure.

Figures 10A, 10B:
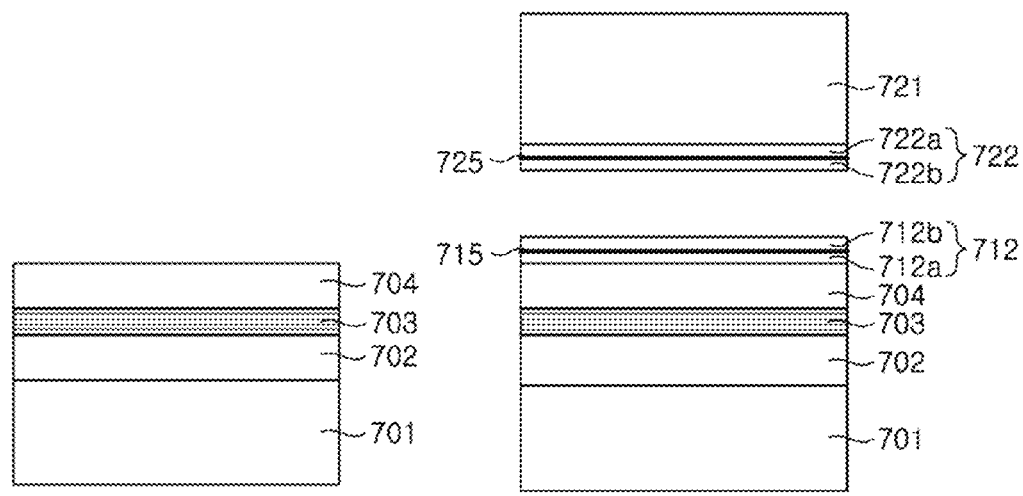
FIGS. 10A through 10D are process cross-sectional views illustrating a method of manufacturing a semiconductor light emitting device according to an exemplary embodiment of the present inventive concept.

Referring to FIG. 10A, a light emitting laminate may be prepared by sequentially growing a first conductivity type semiconductor layer 702, an active layer 703, and a second conductivity type semiconductor layer 704 on a growth substrate 701.

Such a growth process may be performed by using, for example, metal organic chemical vapor deposition (MOCVD) or molecular beam epitaxy (MBE) deposition. The light emitting laminate may be formed of a III-V semiconductor, in particular, a group III nitride semiconductor having a composition of $Al_xGa_yIn_{(1-x-y)}N$ ($0 \leq x \leq 1$, $0 \leq y \leq 1$, $0 \leq x+y \leq 1$). The substrate 701 for growing a nitride semiconductor crystal may be formed of sapphire, SiC, Si, $MgAl_2O_4$, MgO, $LiAlO_2$ or $LiGaO_2$.

Then, as illustrated in FIG. 10B, a first bonding metal layer 712 may be formed on the light emitting laminate (for example, on the second conductivity type semiconductor layer 704), and a second bonding metal layer 722 may be formed on a bonding surface of a permanent substrate 721.

The permanent substrate 721 may be a conductive substrate. For example, the permanent substrate 721 may be a Si substrate or a Si—Al alloy substrate. The first and second bonding metal layers 712 and 722 may include reaction delay layers 715 and 725, respectively. The first bonding metal layer 712 may include a first reaction layer 712a and a second reaction layer 712b that react with each other to form a eutectic metal, and the second bonding metal layer 722 may include a first reaction layer 722a and a second reaction layer 722b that react with each other to form a eutectic metal. The reaction delay layer 715 may be disposed between the first reaction layer 712a and the second reaction layer 712b. The reaction delay layer 725 may be disposed between the first reaction layer 722a and the second reaction layer 722b.

The first reaction layers 712a and 722a, e.g., layers connected to the permanent substrate 721 and the light emitting laminate as bonding objects, may contain at least one metal selected from Ni, Pt, Au, Cu and Co. The second reaction layers 712b and 722b may contain a metal selected from Sn, In, Zn, Bi, Au, Co, or an alloy thereof.

The reaction delay layers 715 and 725 may contain a metal selected from Ti, W, Cr, Ta, or an alloy thereof. The reaction delay layers 715 and 725 may each have a thickness of 10 Å to 1000 Å.

Figures 10C, 10D:
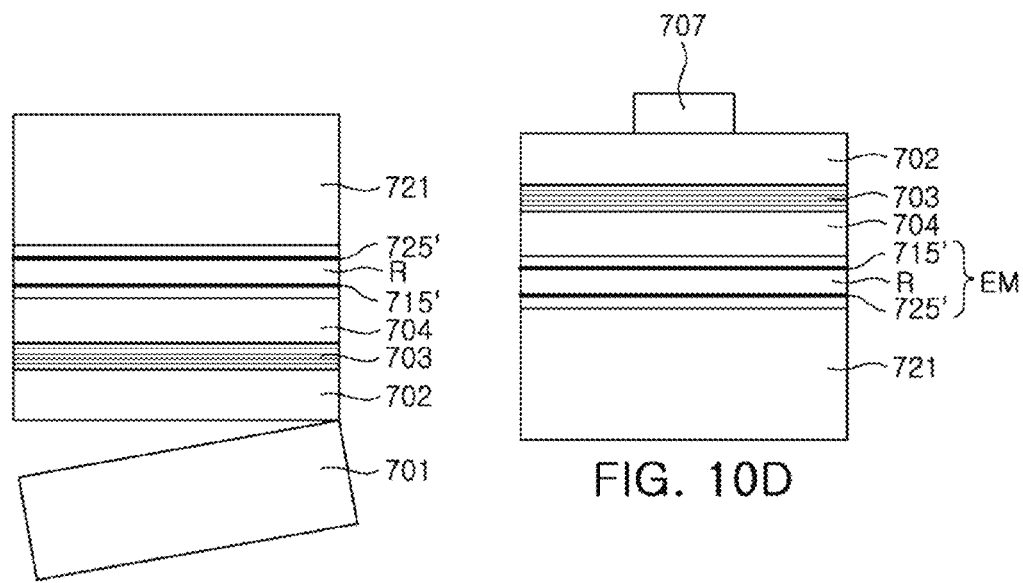

Then, the permanent substrate 721 may be disposed on the second conductivity type semiconductor layer 704 such that the first bonding metal layer 712 and the second bonding metal layer 722 face each other, and subsequently, heat may be applied thereon to melt the first and second bonding metal layers 712 and 722, thereby forming a desired eutectic metal bonding layer EM. In the process in which the melted second reaction layers 712b and 722b may flow and react with the first reaction layers 712a and 722a to form a eutectic metal, the reaction may be delayed by the reaction delay layers 715 and 725 (or remaining reaction delay layers 715' and 725' as shown in FIGS. 10C and 10D) employed in an exemplary embodiment of the present inventive concept, whereby a sufficient amount of flow time may be secured. As a result, a high degree of filling rate may be obtained throughout the overall bonding region. That is, the generation of voids in the eutectic metal may be suppressed.

Then, as illustrated in FIG. 10C, the growth substrate 701 may be separated from the first conductivity type semiconductor layer 702. Such a separation process may be performed by irradiating a laser on an interface between the growth substrate 701 and the first conductivity type semiconductor layer 702.

Subsequently, as illustrated in FIG. 10D, a first electrode 707 may be formed on an exposed surface of the first conductivity type semiconductor layer 702, exposed by separating the growth substrate 701 therefrom. As needed, a bonding electrode may be further formed on another surface of the permanent substrate 721, opposite to the bonding surface thereof.

In this manner, even in a case in which the bonding surface of the light emitting laminate or the bonding surface of the permanent substrate 721 has a stepped portion or an uneven portion, the generation of voids may be effectively suppressed to form a stable eutectic metal bonding layer EM, thereby significantly improving adhesion reliability.

Figure 11A:
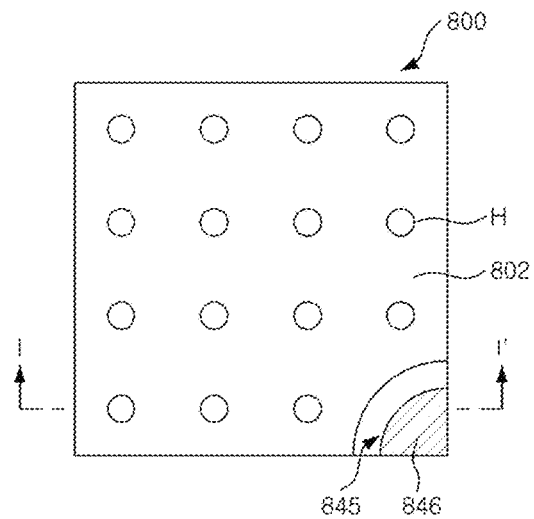
FIGS. 11A and 11B are a plan view and a side cross-sectional view illustrating an example of a semiconductor light emitting device that may be manufactured using the method of manufacturing a semiconductor light emitting device according to an exemplary embodiment of the present inventive concept.
Figure 11B:
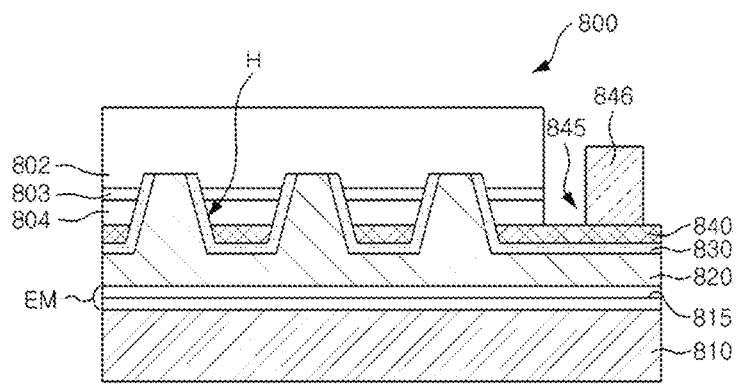

Such a method of manufacturing a semiconductor light emitting device as described above may be usefully employed in other semiconductor light emitting devices having various structures. FIGS. 11A and 11B are a plan view and a side cross-sectional view illustrating an example of a semiconductor light emitting device that may be manufactured using the method of manufacturing a semiconductor light emitting device according to an exemplary embodiment of the present inventive concept.

As illustrated in FIGS. 11A and 11B, a semiconductor light emitting device 800 may include a conductive substrate 810 as a permanent substrate, a first electrode layer 820, an insulating layer 830, a second electrode layer 840, a second conductivity type semiconductor layer 804, an active layer 803, and a first conductivity type semiconductor layer 802. For example, the first conductivity type semiconductor layer 802 may be an n-type nitride semiconductor and the second conductivity type semiconductor layer 804 may be a p-type nitride semiconductor.

The first electrode layer 820 may be stacked and provided on the conductive substrate 810. In addition, a contact hole H may penetrate through the insulating layer 830, the second electrode layer 840, the second conductivity type semiconductor layer 804, and the active layer 803, and be extended to a certain region of the first conductivity type semiconductor layer 802. A portion of the first electrode layer 820 may contact the first conductivity type semiconductor layer 802 via the contact hole H, as illustrated in FIG. 11B. Thereby, the conductive substrate 810 and the first conductivity type semiconductor layer 802 may be electrically connected to each other.

In this manner, the first electrode layer 820 may electrically connect the conductive substrate 810 and the first conductivity type semiconductor layer 802 to each other via the contact hole H.

Meanwhile, the semiconductor light emitting device 800 may include the insulating layer 830 such that the first electrode layer 820 may be electrically insulated from another layer, other than the conductive substrate 810 and the first conductivity type semiconductor layer 802. The insulating layer 830 may be positioned between the second electrode layer 840, the second conductivity type semiconductor layer 804, and the active layer 803 that are exposed by the contact hole H, as well as between the first electrode layer 820 and the second electrode layer 840.

The second electrode layer 840 may be positioned to be connected to the second conductivity type semiconductor layer 804. The second electrode layer 840 may contain one metal selected from Ag, Al and Pt in consideration of ohmic contact and reflectance characteristics. In addition, as illustrated in FIG. 11A, the second electrode layer 840 may have a region 845 exposed outwardly, and an electrode pad 846 for connection with external power may be disposed on the exposed region 845. In the exemplary embodiment of FIGS. 11A and 11B, a single exposed region 845 and a single electrode pad 846 are illustrated, but one or more exposed regions and one or more electrode pads may be provided.

As illustrated in FIG. 11B, the semiconductor light emitting device 800 may be obtained by forming a eutectic metal bonding layer EM between the conductive substrate 810 and the first electrode layer 820. A light emitting laminate may be bonded to the conductive substrate 810 using the forming process of the eutectic metal bonding layer EM described above.

That is, the eutectic metal bonding layer EM may be formed of a eutectic metal obtained by reacting melted metals or alloys with each other, and may be formed of a eutectic metal containing a metal selected from Sn, In, Zn, Bi, Pb, Ni, Au, Pt, Cu, Co and an alloy thereof.

In addition, the eutectic metal bonding layer EM may include a reaction delay layer 815. The reaction delay layer 815 may be formed of a metal selected from Ti, W, Cr, Ta, or an alloy thereof. The reaction delay layer 815 may delay a reaction process for forming a eutectic metal during a bonding operation.

In a final product, since the reaction delay layer 815 may be deformed in the reaction process for forming the eutectic metal, it may not have a complete layer structure. For example, the remnant reaction delay layer 815 may have a discontinuous or uneven thickness.

A method for retaining a surface of a bonding metal layer to be suitable for a bonding operation according to an exemplary embodiment of the present inventive concept may be provided, in addition to a method of introducing a reaction delay layer in the bonding metal layer to delay a reaction process. By way of example, an oxidation prevention layer may be introduced so as not to oxidize the surface of the bonding metal layer, such that deterioration in bonding strength of a eutectic metal bonding layer due to an undesirable oxide may be prevented. This exemplary embodiment will be described in detail with reference to FIGS. 12 and 15.

Figure 12:
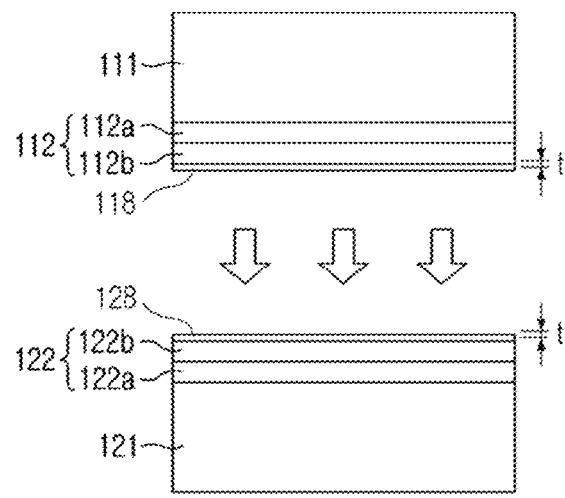
FIG. 12 is a cross-sectional view illustrating a eutectic metal layer used in the method of forming a metal bonding layer including oxidation prevention layer according to an exemplary embodiment of the present inventive concept.

FIG. 12 is a cross-sectional view illustrating a eutectic metal layer used in the method of forming a metal bonding layer including oxidation prevention layer according to an exemplary embodiment of the present disclosure.

FIG. 12 illustrates the first substrate 111 having one surface on which the first bonding metal layer 112 is formed, and the second substrate 121 having one surface on which the second bonding metal layer 122 is formed.

Similarly to the foregoing embodiment (e.g., the embodiment of FIG. 6), the first bonding metal layer 112 may include the first reaction layer 112a formed on one surface of the first substrate 111 and the second reaction layer 112b formed on the first reaction layer 112a. The second bonding metal layer 122 may also include the first reaction layer 122a formed on one surface of the second substrate 121 and the second reaction layer 122b formed on the first reaction layer 122a. In an exemplary embodiment of the present inventive concept, the second reaction layers 112b and 122b may be formed of Sn or AuSn. In this case, the first reaction layers 112a and 122a may be formed of Ni. In addition to Ni, the first reaction layers 112a and 122a may be formed of Pt, Au, Cu or Co.

Further, the first and second bonding metal layers 112 and 122 may include oxidation prevention layers 118 and 128 formed on bonding surfaces thereof. In an exemplary embodiment of the present inventive concept, the oxidation prevention layers 118 and 128 may be cap layers and may be formed on the second reaction layers 112b and 122b.

Each of the oxidation prevention layers 118 and 128 may be formed of a material different from a material of a corresponding bonding metal layer disposed below the oxidation prevention layer, and may be introduced in order to prevent the material of the bonding metal layer from being oxidized, prior to or during a bonding process. In an exemplary embodiment of the present inventive concept, the oxidation prevention layers 118 and 128 may be formed of a material having an oxidation reactivity lower than an oxidation reactivity of the second reaction layers 112b and 122b. For example, a material of the oxidation prevention layers 118 and 128 may be selected from Pd, Pt, Ru, Rh, Ag, Os, Ir, Au or a combination (e.g., an alloy) thereof. Preferably, the oxidation prevention layers 118 and 128 may be formed of Pd, Pt or a combination thereof.

Although not limited hereto, since the oxidation prevention layers 118 and 128 may be positioned on the bonding surfaces, the oxidation prevention layers 118 and 128 may have appropriate thicknesses such that they do not substantially hinder a reaction between the bonding metal layers.

For example, a thickness t of each of the oxidation prevention layers 118 and 128 may be 100 Å or less. In addition, in order to obtain sufficient oxidation prevention effects, the thickness t of each of the oxidation prevention layers 118 and 128 may be 5 Å or more, preferably, 10 Å or more.

Figure 13A:
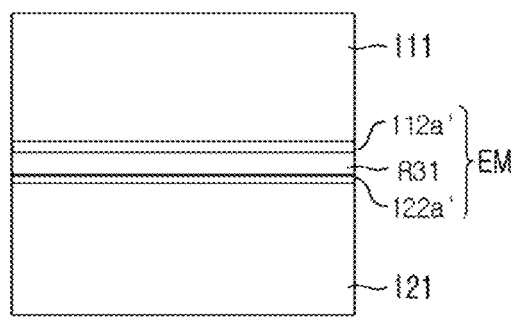
FIGS. 13A and 13B are cross-sectional views illustrating various examples of the metal bonding layer that may be formed through a reaction of bonding metal layers in accordance with FIG. 12.
Figure 13B:
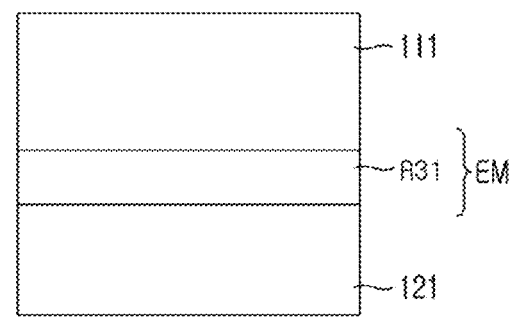

FIGS. 13A and 13B show structures of eutectic metal bonding layers EM obtainable using the first and second bonding metal layers 112 and 122 illustrated in FIG. 12.

As illustrated in FIG. 13A, a mixture layer R31 including a eutectic metal formed of NiSn or NiSn/Sn/NiSn (or NiSnAu when the first reaction layer is formed of AuSn) may be formed in a central region of the eutectic metal bonding layer EM. Since the oxidation prevention layers 118 and 128 having relatively reduced thicknesses may be introduced, they do not remain as layers and may be distributed within the mixture layer R31. The Ni layers 112a' and 122a' may remain between the mixture layer R31 and the first and second substrates 111 and 121.

As illustrated in FIG. 13B, in another example of the eutectic metal bonding layer EM, a first mixture layer R31 including a eutectic metal formed of NiSn (or NiSnAu when the first reaction layer is formed of AuSn) may be formed in a central region of the eutectic metal bonding layer EM. Unlike the foregoing exemplary embodiment, e.g., the embodiment of FIG. 13A, the Ni layers may rarely remain on periphery portions of the mixture layer R31 and may all be reacted to provide NiSn or NiAuSn.

In this manner, although the same bonding metal layers illustrated in FIG. 12 are used, various forms of bonding systems, the eutectic metal bonding layers EM as illustrated in FIGS. 13A and 13B may be formed depending on a bonding process actually used. Meanwhile, the eutectic metal bonding layers EM as illustrated in FIGS. 13A and 13B may be understood as being formed in a series of processes in which a reaction process proceeds in the order as illustrated in FIGS. 13A and 13B, together with diffusion.

Another example of employing oxidation prevention layers will be described with reference to bonding metal layers illustrated in FIG. 14.

Figure 14:
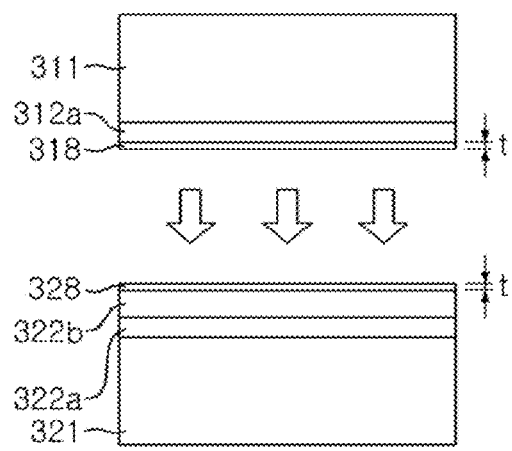
FIG. 14 is a cross-sectional view illustrating a eutectic metal layer used in the method of forming a metal bonding layer including an oxidation prevention layer according to an exemplary embodiment of the present inventive concept.

FIG. 14 illustrates, as bonding objects, a first substrate 311 having one surface on which a first bonding metal layer 312 is formed, and a second substrate 321 having one surface on which a second bonding metal layer 322 is formed.

The first bonding metal layer 312 may include a reaction layer 312a formed on one surface of the first substrate 311 and unlike this, the second bonding metal layer 322 may also include a first reaction layer 322a formed on one surface of the second substrate 321 and a second reaction layer 322b formed on the first reaction layer 322a. In an exemplary embodiment of the present inventive concept, the reaction layer 312a and the first reaction layer 322a may be formed of Ni. In addition to Ni, the reaction layer 312a and the first reaction layer 322a may be formed of Pt, Au, Cu or Co. The second reaction layer 322b may be formed of Sn.

A first oxidation prevention layer 318 may be formed on a surface of the first bonding metal layer 312 and a second oxidation prevention layer 328 may be formed on a surface of the second bonding metal layer 322. The first and second oxidation prevention layers 318 and 328 may be cap layers and may be used to prevent the first and second bonding metal layers 312 and 322 from being oxidized.

The first oxidation prevention layer 318 may be formed of a material having an oxidation reactivity lower than an oxidation reactivity of the reaction layer 312a, and the second oxidation prevention layer 328 may be formed of a material having an oxidation reactivity lower than an oxidation reactivity of the second reaction layer 322b. The first and second oxidation prevention layers 318 and 328 may be selected from Pd, Pt, Ru, Rh, Ag, Os, Ir, Au and a combination thereof. Preferably, the first and second oxidation prevention layers 318 and 328 may be formed of Pd, Pt or a combination thereof. The first and second oxidation prevention layers 318 and 328 may be formed of the same material.

Although not limited hereto, the first and second oxidation prevention layers 318 and 328 may each have a thickness by which sufficient effects could be obtained while they do not substantially hinder a reaction between the bonding metal layers. For example, a thickness of each of the oxidation prevention layers 318 and 328 may be in a range of 10 to 100 Å. Although foregoing exemplary embodiments illustrate that the oxidation prevention layers are formed on the surfaces of both bonding metal layers, even when the oxidation prevention layer is only formed on one surface of one of the both bonding metal layers, surface oxidation prevention effects may be expected.

Figure 15A:
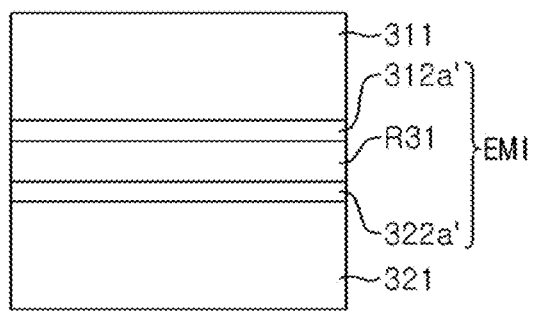
FIGS. 15A and 15B are cross-sectional views illustrating various examples of the metal bonding layer that may be formed through a reaction of bonding metal layers in accordance with FIG. 14.
Figure 15B:
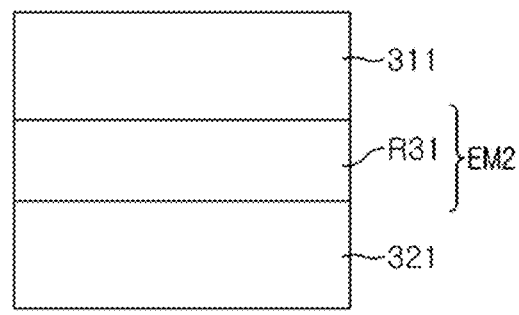

FIGS. 15A and 15B show structures of eutectic metal bonding layers EM obtainable using the first and second bonding metal layers 312 and 322 illustrated in FIG. 14.

In the eutectic metal bonding layer EM illustrated in FIG. 15A, a mixture layer R31 including a eutectic metal formed of a reaction product, NiSn or NiSn/Sn/NiSn (or NiSnAu in a case in which the second reaction layer is formed of AuSn) may be formed. Ni layers 312a' and 322a' may remain between the mixture layer R31 and the first and second substrates 311 and 321. Since the oxidation prevention layers 318 and 328 having relatively reduced thicknesses may be introduced, they do not remain as layers and may be distributed within the mixture layer R31.

The eutectic metal bonding layer EM illustrated in FIG. 15B may be substantially formed to include only the mixture layer R31. That is, the eutectic metal bonding layer EM of FIG. 15B is different from the eutectic metal bonding layer EM of FIG. 15A in that a non-reacted Ni layer rarely remains on the periphery portions of the mixture layer R31.

Figure 18:
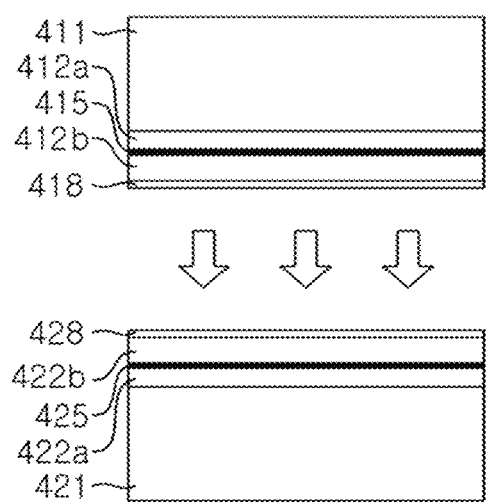
FIG. 18 is a cross-sectional view illustrating a eutectic metal layer used in the method of forming a metal bonding layer including a reaction delay layer and an oxidation prevention layer according to an exemplary embodiment of the present inventive concept.

Unlike the exemplary embodiment described above, the bonding metal layer may include a reaction delay layer together with the oxidation prevention layer. This embodiment of the present inventive concept is illustrated in FIGS. 16 and 18.

Figure 16:
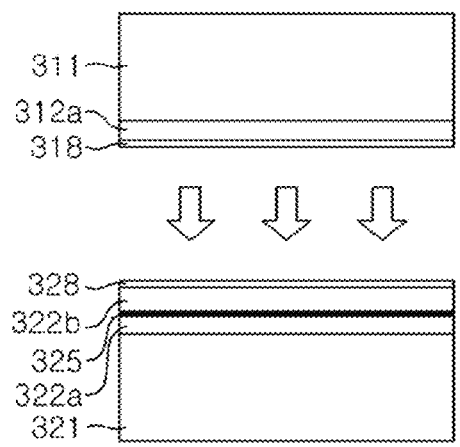
FIG. 16 is a cross-sectional view illustrating a eutectic metal layer used in the method of forming a metal bonding layer including a reaction delay layer and an oxidation prevention layer according to an exemplary embodiment of the present inventive concept.

FIG. 16 illustrates, as bonding objects, the first substrate 311 having one surface on which the first bonding metal layer 312 is formed, and the second substrate 321 having one surface on which the second bonding metal layer 322 is formed.

The first bonding metal layer 312 may include the reaction layer 312a formed on one surface of the first substrate 311 and unlike this, the second bonding metal layer 322 may also include the first reaction layer 322a formed on one surface of the second substrate 321 and the second reaction layer 322b formed on the first reaction layer 322a. In an exemplary embodiment of the present inventive concept, the reaction layer 312a and the first reaction layer 322a may be formed of Ni. In addition to Ni, the reaction layer 312a and the first reaction layer 322a may be formed of Pt, Au, Cu or Co. The second reaction layer 322b may be formed of Sn.

The first oxidation prevention layer 318 may be formed on the surface of the first bonding metal layer 312 and the second oxidation prevention layer 328 may be formed on the surface of the second bonding metal layer 322. The first and second oxidation prevention layers 318 and 328 may be cap layers and may be used to prevent the first and second bonding metal layers 312 and 322 from being oxidized.

The first oxidation prevention layer 318 may be formed of a material having an oxidation reactivity lower than an oxidation reactivity of the reaction layer 312a, and the second oxidation prevention layer 328 may be formed of a material having an oxidation reactivity lower than an oxidation reactivity of the second reaction layer 322b. The first and second oxidation prevention layers 318 and 328 may be selected from Pd, Pt, Ru, Rh, Ag, Os, Ir, Au, or a combination thereof. Preferably, the first and second oxidation prevention layers 318 and 328 may be formed of Pd, Pt, or a combination thereof. The first and second oxidation prevention layers 318 and 328 may be formed of the same material.

Unlike the foregoing embodiment, e.g., the embodiment of FIG. 14, the second bonding metal layer 322 may further include a reaction delay layer 325 in an exemplary embodiment of the present inventive concept. The reaction delay layer 325 may be formed between the first reaction layer 322a and the second reaction layer 322b. The reaction delay layer 325 may be formed of Ti, but is not limited thereto. The reaction delay layer 325 may be formed of W, Cr, Ta or a combination thereof, in addition to Ti.

Figure 17A:
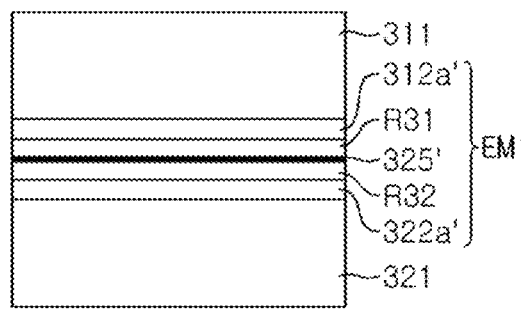
FIGS. 17A and 17B are cross-sectional views illustrating various examples of the metal bonding layer that may be formed through a reaction of bonding metal layers in accordance with FIG. 16.
Figure 17B:
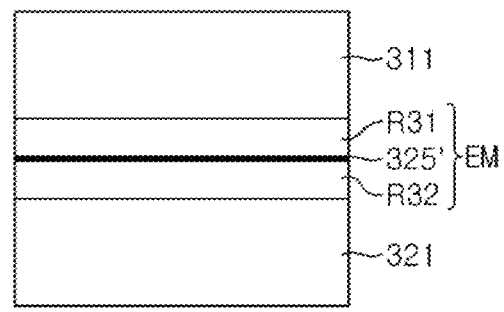

FIGS. 17A and 17B show structures of eutectic metal bonding layers EM obtainable using the first and second bonding metal layers illustrated in FIG. 16.

As illustrated in FIG. 17A, mixture layers R31 and R32 may be formed on periphery portions of a Ti layer 325', the reaction delay layer. The mixture layers R31 and R32 may be formed of NiSn in which an element (for example, Pt or Pd) of the first and second oxidation prevention layers 318 and 328 is contained in a significantly small amount. Ni layers 312a' and 322a' may remain on periphery portions of the mixture layers R31 and R32.

In another example, as illustrated in FIG. 17B, mixture layers R31 and R32 may be formed on periphery portions of a Ti layer 325', the reaction delay layer. The mixture layers R31 and R32 may be formed of NiSn in which an element (for example, Pt or Pd) of the first and second oxidation prevention layers 318 and 328 is contained in a significantly small amount. The structure of the eutectic metal bonding layer EM according to another example is different from the eutectic metal bonding layer EM of FIG. 17A, in that Ni layers may rarely remain and may all be reacted on outer portions of the mixture layers R31 and R32.

In this manner, although the same bonding metal layers illustrated in FIG. 16 are used, various forms of bonding systems, the eutectic metal bonding layers EM as illustrated in FIGS. 17A and 17B may be formed depending on a bonding process actually used. Meanwhile, the eutectic metal bonding layers EM as illustrated in FIGS. 17A and 17B may be understood as being formed in a series of processes in which a reaction process proceeds in the order as illustrated in FIGS. 17A and 17B, together with diffusion.

FIG. 18 illustrates, as bonding objects, a first substrate 411 having one surface on which a first bonding metal layer 412 is formed, and a second substrate 421 having one surface on which a second bonding metal layer 422 is formed.

Unlike the foregoing exemplary embodiment (e.g., the embodiment of FIG. 16), bonding metal layers formed on both of the bonding objects may have a symmetrical structure. That is, the first bonding metal layer 412 may include a first reaction layer 412a formed on one surface of the first substrate 411, a second reaction layer 412b formed on the first reaction layer 412a, and an oxidation prevention layer 418 formed on the second reaction layer 412b.

In a similar manner to this, the second bonding metal layer 412 may include a first reaction layer 422a formed on one surface of the second substrate 421, a second reaction layer 422b formed on the first reaction layer 422a, and an oxidation prevention layer 428 formed on the second reaction layer 422b.

In an exemplary embodiment of the present inventive concept, the first reaction layers 412a and 422a may be formed of Ni. In addition to Ni, the first reaction layers 412a and 422a may be formed of Pt, Au, Cu or Co. The second reaction layer 412b and 422b may be formed of Sn.

The oxidation prevention layers 418 and 428 may be selected from Pd, Pt, Ru, Rh, Ag, Os, Ir, Au, or a combination thereof. Preferably, the oxidation prevention layers 418 and 428 may be formed of Pd, Pt, or a combination thereof.

Further, the reaction delay layers 415 and 425 may be applied to the first and second bonding metal layers 412 and 422. The reaction delay layers 415 and 425 may all be Ti layers. Also, the reaction delay layers 415 and 425 may be formed of W, Cr, Ta or a combination thereof, in addition to Ti.

Figure 19A:
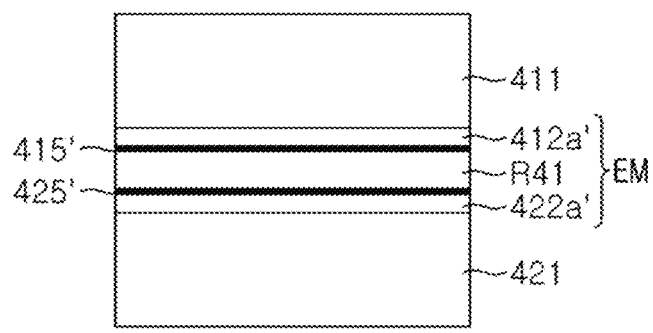
FIGS. 19A through 19c are cross-sectional views illustrating various examples of the metal bonding layer that may be formed through a reaction of bonding metal layers in accordance with FIG. 18.
Figure 19B:
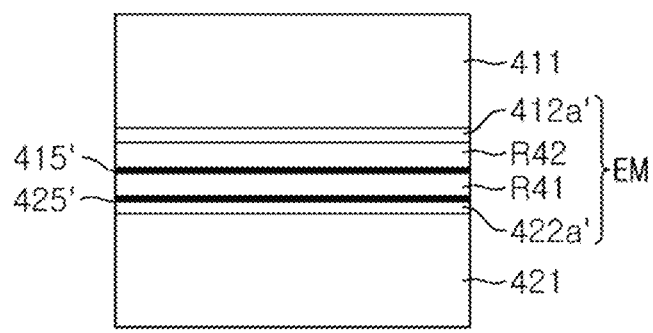
Figure 19C:
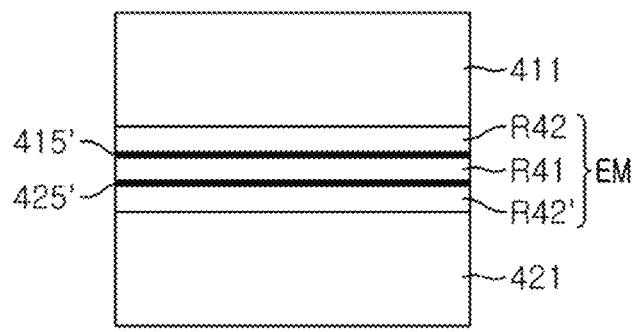

FIGS. 19A through 19C show structures of eutectic metal bonding layers EM obtainable using the first and second bonding metal layers 412 and 422 illustrated in FIG. 18.

As illustrated in FIG. 19A, a mixture layer R41 may be formed in a central region of the eutectic metal bonding layer EM and here, the mixture layer R41 may be formed of NiSn in which an element (for example, Pt or Pd) of the oxidation prevention layers 412b and 422b is contained in a significantly small amount. Ti layers 415' and 425' may remain on periphery portions of the mixture layer R41. As described above, the remaining Ti layers 415' and 425' may be present in a slightly deformed state (e.g., bent or partially disconnected state) in the reaction process. A Ni layer 412a' may remain between the Ti layer 415' and the first substrate 411. A Ni layer 422a' may remain between the Ti layer 425' and the second substrate 421.

In another example, as illustrated in FIG. 19B, a first mixture layer R41 including a eutectic metal formed of NiSn in which an element (for example, Pt or Pd) of the oxidation prevention layers 412b and 422b is contained in a significantly small amount may be formed. Ti layers 415' and 425' may remain on periphery portions of the mixture layer R41. In addition, Sn contained in the mixture layer may be diffused over one Ti layer 415' to thereby form a second mixture layer R42 formed of NiSn. Even in the eutectic metal bonding layer EM according to an exemplary embodiment of the present inventive concept, Ni layers 412a' and 422a' may remain on an interface between the first and second substrates 411 and 421.

In another example of the bonding system, as illustrated in FIG. 19C, a first mixture layer R41 including a eutectic metal formed of NiSn in which an element (for example, Pt or Pd) of the oxidation prevention layers 412b and 422b is contained in a significantly small amount may be formed. Ti layers 415' and 425' may remain on periphery portions of the mixture layer R41, and second mixture layers R42 and R42' formed of NiSn in which Pt or Pd is contained may be formed on outer portions of the Ti layers 415' and 425', respectively. In the eutectic metal bonding layer EM, Ni layers may rarely remain on outer portions of the second mixture layers R42 and R42'.

In this manner, although the same bonding metal layers illustrated in FIG. 18 are used, various forms of bonding systems, the eutectic metal bonding layers EM as illustrated in FIGS. 19A through 19C may be formed depending on a bonding process actually used. Meanwhile, the eutectic metal bonding layers EM as illustrated in FIGS. 19A through 19C may be understood as being formed in a series of processes in which a reaction process proceeds in the order as illustrated in FIGS. 19A through 19C, together with diffusion.

Various forms of the bonding systems as described above may be usefully employed in bonding an electronic device such as a semiconductor light emitting device to a substrate. FIGS. 20A through 20D illustrate a method of manufacturing a semiconductor light emitting device according to another exemplary embodiment of the present inventive concept, using the eutectic metal bonding layer as described above.

FIGS. 20A through 20D are process cross-sectional views illustrating a method of manufacturing a semiconductor light emitting device according to another exemplary embodiment of the present inventive concept. The exemplary embodiment of FIGS. 20A through 20D has a form similar to that illustrated in FIGS. 10A through 10D, and the same reference numerals may be understood to designate the same or like elements.

Figure 20A:
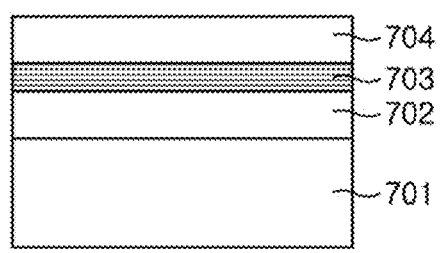
FIGS. 20A through 20D are process cross-sectional views illustrating a method of manufacturing a semiconductor light emitting device according to another exemplary embodiment of the present inventive concept.

Referring to FIG. 20A, a light emitting laminate may be prepared by sequentially growing the first conductivity type semiconductor layer 702, the active layer 703, and the second conductivity type semiconductor layer 704 on the growth substrate 701, in a similar manner to the case of FIG. 10A.

Figure 20B:
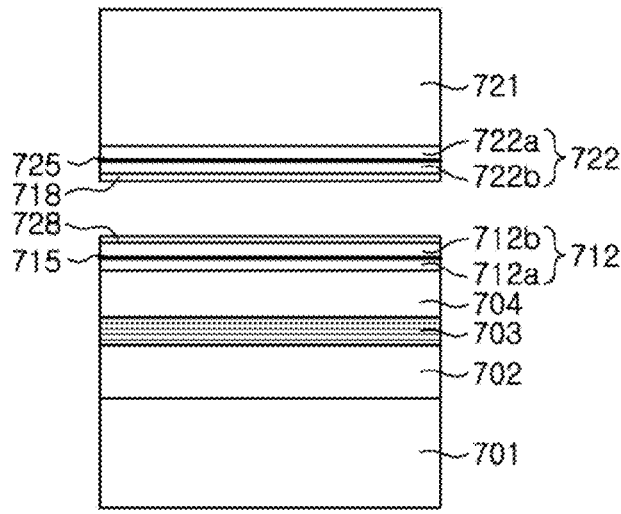

Then, as illustrated in FIG. 20B, the first bonding metal layer 712 may be formed on the light emitting laminate (in particular, the second conductivity type semiconductor layer 704), and the second bonding metal layer 722 may be formed on a bonding surface of the permanent substrate 721.

The first bonding metal layer 712 may include the first reaction layer 712a and the second reaction layer 712b that react with each other to form a eutectic metal, and the second bonding metal layer 722 may include the first reaction layer 722a and the second reaction layer 722b that react with each other to form a eutectic metal. The reaction delay layer 715 may be disposed between the first reaction layer 712a and the second reaction layer 712b. The reaction delay layer 725 may be disposed between the first reaction layer 722a and the second reaction layer 722b.

The first reaction layers 712a and 722a, layers connected to the permanent substrate 721 and the light emitting laminate as bonding objects, may contain at least one metal selected from Ni, Pt, Au, Cu and Co. The second reaction layers 712b and 722b may contain a metal selected from Sn, In, Zn, Bi, Au, Co, or a combination (e.g., alloy) thereof. The reaction delay layers 715 and 725 may contain a metal selected from Ti, W, Cr, Ta, and a combination (including an alloy) thereof.

Additionally, in an exemplary embodiment of the present inventive concept, oxidation prevention layers 718 and 728 serving as cap layers may be disposed on surfaces of the first and second bonding metal layers 712 and 722, respectively. The oxidation prevention layers 718 and 728 may be formed of a material having an oxidation reactivity lower than an oxidation reactivity of the second reaction layers 712b and 722b. For example, the oxidation prevention layers 718 and 728 may be selected from Pd, Pt, Ru, Rh, Ag, Os, Ir, Au, or a combination (including an alloy) thereof. Preferably, the oxidation prevention layers 718 and 728 may be formed of Pd, Pt, or a combination thereof.

Although not limited hereto, the oxidation prevention layers 718 and 728 may each have a thickness by which sufficient effects could be obtained while they do not substantially hinder a reaction between the bonding metal layers. For example, a thickness of each of the oxidation prevention layers 718 and 728 may be in a range of 10 to 100 Å.

Then, the permanent substrate 721 may be disposed on the second conductivity type semiconductor layer 704 such that the first bonding metal layer 712 and the second bonding metal layer 722 face each other, and subsequently, heat may be applied thereon to melt the first and second bonding metal layers 712 and 722, thereby forming a desired eutectic metal bonding layer EM.

A bonding interface state advantageous to obtain bonding strength may be obtained by suppressing oxidation layers from being generated on the surfaces of the first and second bonding metal layers 712 and 722. Further, the reaction delay layers 715 and 725 (and remaining reaction delay layers 715' and 725' as shown in FIGS. 20C and 20D) may delay reactions between the first reaction layers 712a and 722a and the second reaction layers 712b and 722b, respectively, to thereby secure a high degree of filling rate throughout the overall bonding region.

Figure 20C:
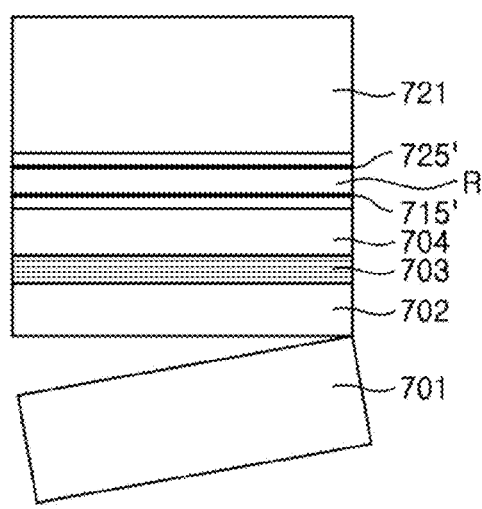

Then, as illustrated in FIG. 20C, the growth substrate 701 may be separated from the first conductivity type semiconductor layer 702. Such a separation process may be performed by irradiating a laser on an interface between the growth substrate 701 and the first conductivity type semiconductor layer 702.

Figure 20D:
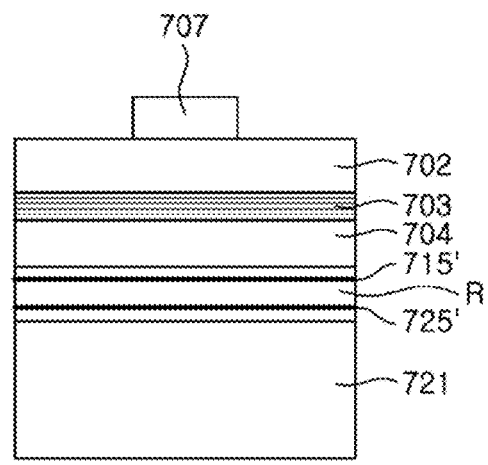

Subsequently, as illustrated in FIG. 20D, the first electrode 707 may be formed on an exposed surface of the first conductivity type semiconductor layer 702, exposed by separating the growth substrate 701 therefrom. As needed, a bonding electrode may be further formed on a surface of the permanent substrate 721, opposite to the bonding surface thereof.

In this manner, the generation of oxides may be prevented on a bonding surface (e.g., a surface to be bonded), and a reaction speed may be delayed to suppress the occurrence of voids, thereby forming a stable eutectic metal bonding layer EM. Therefore, bonding reliability may be significantly improved.

Such a method of manufacturing a semiconductor light emitting device may be usefully applied to various different structures of semiconductor light emitting devices. FIGS. 21A through 21D illustrate a method of manufacturing a semiconductor light emitting device according to another exemplary embodiment of the present inventive concept.

Figure 21A:
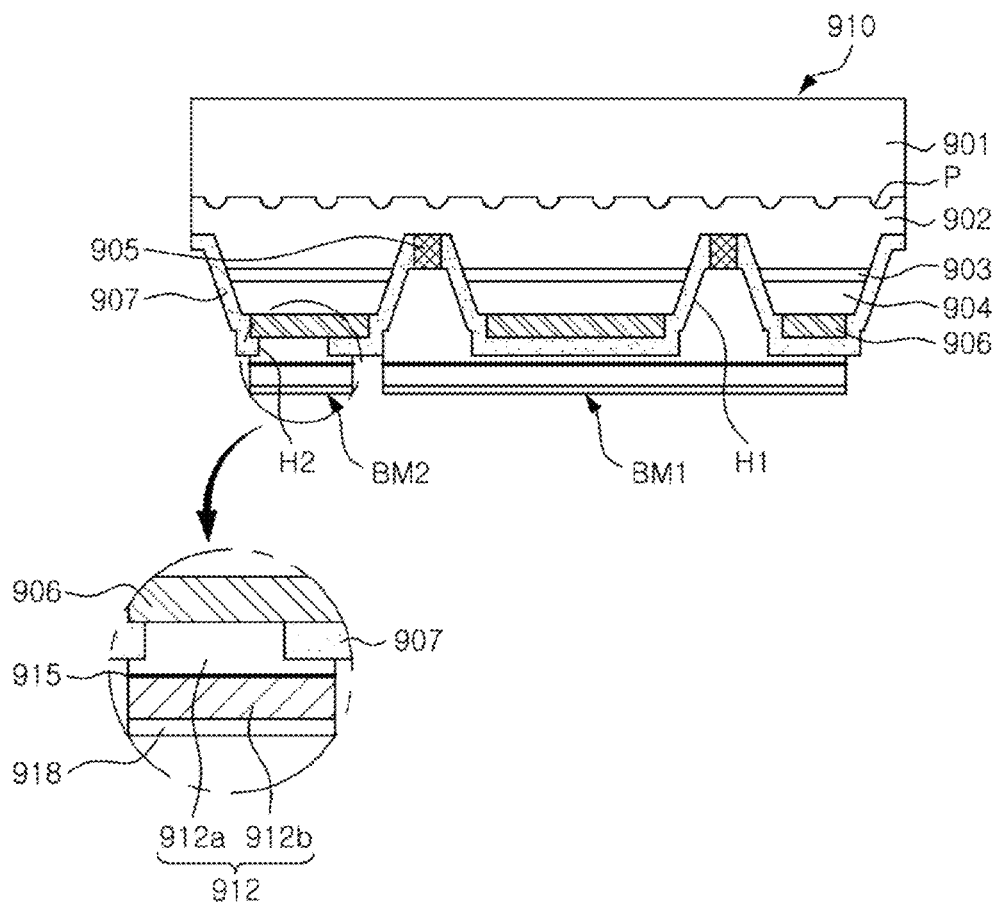
FIGS. 21A through 21D are process cross-sectional views illustrating a method of manufacturing a semiconductor light emitting device according to another exemplary embodiment of the present inventive concept.

Referring to FIG. 21A, a semiconductor light emitting device having a structure different from that of the semiconductor light emitting device illustrated in FIG. 20A is illustrated.

A semiconductor light emitting device 910 shown in FIG. 21A may include a substrate 901 and a light emitting laminate disposed on the substrate 901. The light emitting laminate may include a first conductivity type semiconductor layer 902, an active layer 903, and a second conductivity type semiconductor layer 904.

The substrate 901 may be an insulating substrate, a conductive substrate, or a semiconductor substrate. For example, the substrate 901 may be formed of sapphire, SiC, Si, $MgAl_2O_4$, MgO, $LiAlO_2$, $LiGaO_2$, or GaN. A surface of the substrate 901 may have semi-spherical type unevenness structures P. A shape of the unevenness structures P is not limited, and unevenness structures having other polyhedral forms or irregular shapes may be provided.

The first conductivity type semiconductor layer 902 may be a nitride semiconductor formed of n-type $Al_xIn_yGa_{1-x-y}N$ ($0 \le x \le 1$, $0 \le y \le 1$, $0 \le x+y \le 1$), and n-type impurities may be Si. For example, the first conductivity type semiconductor layer 902 may be an n-type GaN layer. The active layer 903 may have a multiple quantum well (MQW) structure in which quantum barrier and quantum well layers are alternately stacked. For example, when the active layer 903 is formed of a nitride semiconductor, a GaN/InGaN structure may be used. The active layer 903 may also have a single quantum well (SQW) structure. The second conductivity type semiconductor layer 904 may be a nitride semiconductor formed of p-type $Al_xIn_yGa_{1-x-y}N$, and p-type impurities may be Mg. For example, the second conductivity type semiconductor layer 904 may be a p-type AlGaN/GaN layer.

The semiconductor laminate employed in an exemplary embodiment of the present inventive concept may have a region in which the first conductivity type semiconductor layer 902 is exposed and a first contact electrode 905 may be disposed on the exposed region. A second contact electrode 906 may be disposed on an upper surface of the second conductivity type semiconductor layer 904. The first and second contact electrodes 905 and 906 are not limited hereto, but may include a material such as Ag, Ni, Al, Rh, Pd, Ir, Ru, Mg, Zn, Pt, Au, or the like. The first and second contact electrodes 905 and 906 may be used in the form of a single layer or two or more layers. For example, the first contact electrode 905 may include Cr or Au, and the second contact electrode 906 may include Ag.

The semiconductor light emitting device 910 may include an insulating layer 907 disposed on the light emitting laminate. The insulating layer 907 may be formed of $SiO_2$ or SiN. The insulating layer 907 may have a first opening H1 connected to a portion of the first contact electrode 905 and a second opening H2 connected to a portion of the second contact electrode 906. As needed, a plurality of first openings H1 and a plurality of second openings H2 may be provided. The plurality of first and second openings H1 and H2 may be arranged at predetermined intervals.

Referring to FIG. 21A, first and second bonding electrodes BM1 and BM2 may be disposed on the insulating layer 907 so as to be separated from each other. The first bonding electrode BM1 may be electrically connected to the first contact electrode 905 through the first opening H1. The second bonding electrode BM2 may be electrically connected to the second contact electrode 906 through the second opening H2.

The bonding electrodes BM1 and BM2 may include first bonding metal layers 912 including first reaction layers 912a and second reaction layers 912b that react with each other to form a eutectic metal. Reaction delay layers 915 may be respectively disposed between the first and second reaction layers 912a and 912b.

The first reaction layers 912a, layers connected to the light emitting laminate, may contain at least one metal selected from Ni, Pt, Au, Cu and Co. The second reaction layers 912b may contain a metal selected from Sn, In, Zn, Bi, Au, Co or a combination (including an alloy) thereof.

The reaction delay layers 915 may contain a metal selected from Ti, W, Cr, Ta, or an alloy thereof.

Additionally, in an exemplary embodiment of the present inventive concept, oxidation prevention layers 918 serving as cap layers may be disposed on surfaces of the first bonding metal layers 912. The oxidation prevention layers 918 may be formed of a material having an oxidation reactivity lower than an oxidation reactivity of the first reaction layers 912a. For example, the oxidation prevention layers 918 may be selected from Pd, Pt, Ru, Rh, Ag, Os, Ir, Au or a combination (including an alloy) thereof. Preferably, the oxidation prevention layers 918 may be formed of Pd, Pt, or a combination thereof.

Although not limited hereto, the oxidation prevention layers 918 may have thicknesses by which sufficient effects could be obtained while they do not substantially hinder a reaction between the bonding metal layers. For example, a thickness of the oxidation prevention layer 918 may be in a range of 10 to 100 Å.

Figure 21B:
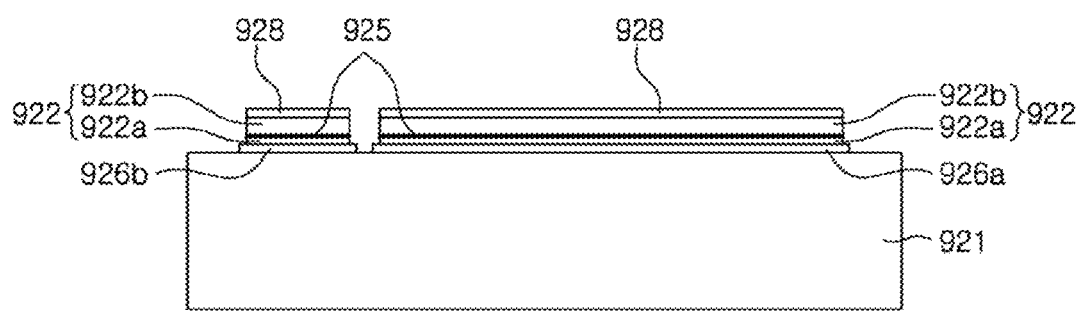

Referring to FIG. 21B, a permanent substrate 921 that may be provided as a package substrate of the semiconductor light emitting device 910 may be prepared. The permanent substrate 921 may include first and second electrodes 926a and 926b, and second bonding metal layers 922 similar to the first bonding metal layers 912 may be disposed on the first and second electrodes 926a and 926b, respectively.

The second bonding metal layers 922 may include first reaction layers 922a, reaction delay layers 925, second reaction layers 922b, and oxidation prevention layers 928, that are sequentially disposed on the first and second electrodes 926a and 926b. The respective layers may be formed of similar materials to those of corresponding elements of the first bonding metal layers 912. Although the exemplary embodiment of FIG. 21B illustrates that the second bonding metal layers 922 have structures corresponding to those of the first bonding metal layers, the first and second bonding metal layers may have different layers from each other. For example, one of the first and second bonding metal layers 912 and 922 may not include the reaction delay layers or the oxidation prevention layers and further, corresponding layers thereof may be formed of different materials from each other.

Figure 21C:
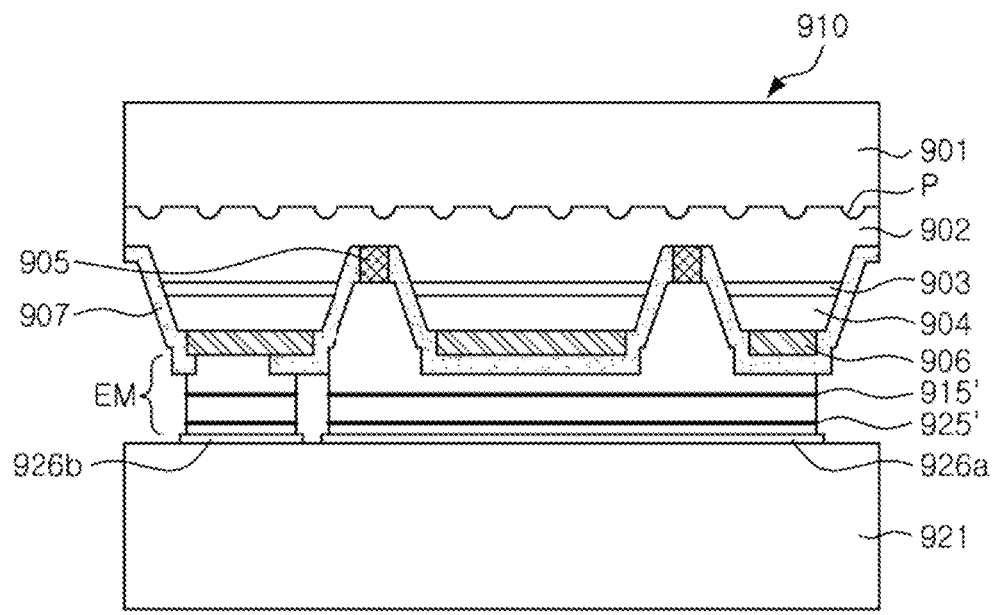

Then, as illustrated in FIG. 21C, the semiconductor light emitting device 910 may be disposed on the permanent substrate 921 such that the first and second bonding metal layers 912 and 922 face each other, and subsequently, heat may be applied thereon to melt the first and second bonding metal layers 912 and 922, thereby forming a desired eutectic metal bonding layer EM.

A bonding interface surface advantageous to obtain bonding strength may be obtained by suppressing oxidation layers from being generated on the surfaces of the first and second bonding metal layers 912 and 922, prior to or during a bonding process. Further, the reaction delay layers 915 and 925 may delay reactions between the first reaction layers 912a and 922a and the second reaction layers 912b and 922b, respectively, to thereby secure a high degree of filling rate throughout the overall bonding region.

Figure 21D:
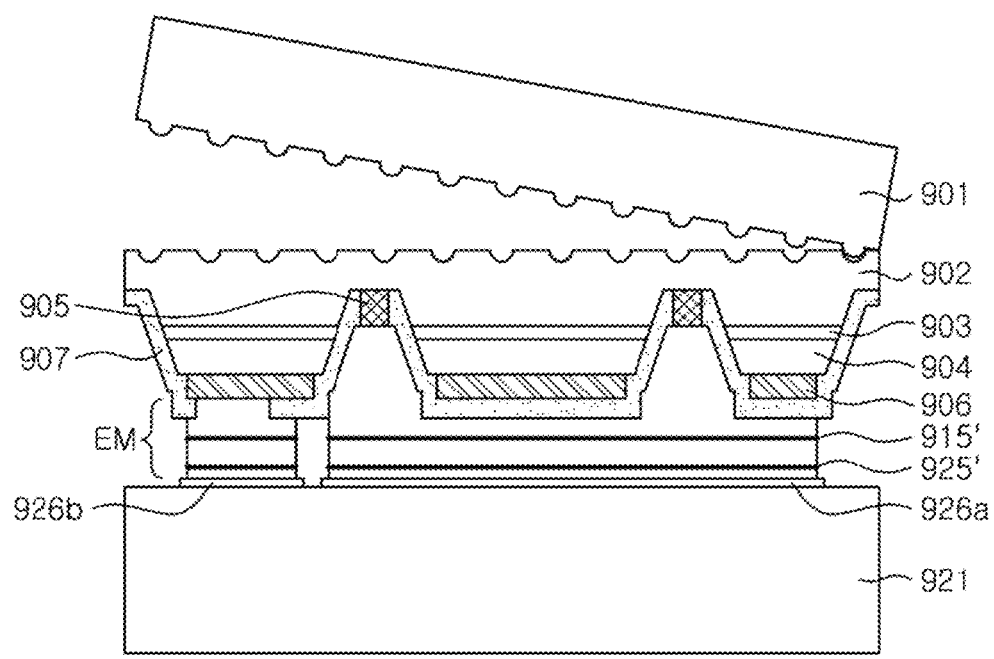

Then, as illustrated in FIG. 21D, the growth substrate 901 may be separated from the first conductivity type semiconductor layer 902. Such a separation process may be performed by irradiating a laser on an interface between the growth substrate 901 and the first conductivity type semiconductor layer 902. As needed, a wavelength conversion unit such as a fluorescent layer or an optical lens may be further formed on an opposite surface of the permanent substrate 921.

Although exemplary embodiments of the present inventive concept illustrate a single semiconductor light emitting device, the illustration is merely provided for the convenience of explanation. In practice, a process of bonding a wafer on which a plurality of semiconductor light emitting devices may be provided, to a permanent substrate corresponding to the wafer may be implemented, and a form of individually mounting the plurality of semiconductor light emitting devices that are separately provided in individual chip units on the permanent substrate may also be realized.

Hereinafter, operations and effects of the oxidation prevention layer employed in an exemplary embodiment of the present inventive concept will be described in detail with reference to the following Examples.

Inventive Example 3

A Ni layer and a Sn layer (as a first bonding metal layer) having thicknesses of 8000 Å and 11000 Å, respectively, and provided as first and second reaction layers, respectively, were formed on an epitaxial layer on a wafer level for a GaN light emitting device. Here, a Ti layer having a thickness of 1000 Å and serving as an adhesion layer was further provided between the Ni layer and the epitaxial layer. A Ni layer and a Sn layer (as a second bonding metal layer) having thicknesses of 6000 Å and 8000 Å, respectively, and provided as first and second reaction layers, respectively, were formed on a silicon substrate.

Pt layers serving as oxidation prevention layers were provided on surfaces of the first and second bonding metal layers, that is, on the surfaces of the both Sn layers, while thicknesses (e.g., 15 Å, 30 Å, and 50 Å) of the Pt layers were differentially provided for respective samples.

Subsequently, heat was applied to bond the GaN light emitting device and the silicon substrate to each other through the first and second bonding metal layers, such that a eutectic metal bonding layer was formed.

Inventive Example 4

An oxidation prevention layer and a reaction delay layer were applied to the Inventive Example and correspondingly formed effects were determined.

A Ni layer (as a first bonding metal layer) having a thickness of 8000 Å was formed on an epitaxial layer on a wafer level for a GaN light emitting device. Here, a Ti layer having a thickness of 1000 Å and serving as an adhesion layer was further provided between the Ni layer and the epitaxial layer. A Ni layer and a Sn layer (as a second bonding metal layer) having thicknesses of 6000 Å and 19000 Å, respectively, and provided as first and second reaction layers, respectively, were formed on a silicon substrate.

Pt layers serving as oxidation prevention layers were provided on surfaces of the first and second bonding metal layers, that is, on the surfaces of the Ni layer and the Sn layer, while thicknesses (e.g., 15 Å, 25 Å, and 50 Å) of the Pt layers were differentially provided for respective samples.

Subsequently, heat was applied to bond the GaN light emitting device and the silicon substrate to each other through the first and second bonding metal layers, such that a eutectic metal bonding layer was formed.

After bonding processes of the samples obtained from Inventive Examples 3 and 4 have been completed, bonding states of the respective samples were macroscopically observed and evaluated by the SAM analysis. Bonding states of the individual samples were evaluated as "very good", "good" and "defective" depending on an area in which bonding defects occurred, and were indicated in the following Table 1 and Table 2.

TABLE 1

| | Samples in Inventive Example 3 | | |
|---|---|---|---|
| | 3A | 3B | 3C |
| Pt Thickness (Å) | 15 | 30 | 50 |
| Bonding State Evaluation | Good | Very Good | Very Good |

TABLE 2

| | Samples in Inventive Example 4 | | | | | |
|---|---|---|---|---|---|---|
| | 4A-1 | 4B-1 | 4C-1 | 4A-2 | 4B-2 | 4C-2 |
| Pt Thickness (Å) | 15 | 25 | 50 | 15 | 25 | 50 |
| Ti Thickness (Å) | 100 | 100 | 100 | 200 | 200 | 200 |
| Bonding State Evaluation | Good | Good | Very Good | Good | Good | Very Good |

As a result of the Inventive Examples, it is confirmed that the bonding states were significantly improved due to the introduction of the oxidation prevention layer and although effects thereof were slightly different depending on the thicknesses, when the thickness of the oxidation prevention layer was 10 Å or more, preferably, 3 Å or more, improvements due to oxidation prevention effects were significant.

As set forth above, according to exemplary embodiments of the present inventive concept, the generation of voids within a eutectic metal bonding layer obtained through a reaction of bonding metal layers between two bonding objects may be effectively suppressed, and high bonding strength may be maintained. For example, the bonding layer may be usefully employed in a transfer technology for an electronic device such as a semiconductor light emitting device. In particular, when a bonding surface is a non-flat surface having an unevenness structure or stepped portion, the generation of voids that may be easily caused in the eutectic metal bonding layer may be significantly suppressed.

When an oxidation privation layer is applied to a surface of the bonding metal layer, a phenomenon in which the surface of the bonding metal layer is oxidized prior to or during a bonding process may be inhibited, whereby a deterioration in bonding strength due to the surface oxidation may be solved to thereby ensure reliable bonding strength.

While exemplary embodiments have been shown and described above, it will be apparent to those skilled in the art that modifications and variations could be made without departing from the spirit and scope of the present disclosure as defined by the appended claims.

What is claimed is:

1. A method of forming a metal bonding layer, the method comprising:
    forming first and second bonding metal layers on one surface of first and second bonding objects, respectively, such that at least one of the first bonding metal layer and the second bonding metal layer includes:
        a first reaction layer formed on one surface of the first or second bonding object and containing a first metal, a second reaction layer formed on the first reaction layer and containing a second metal for reacting with the first metal to provide a eutectic metal, and a reaction delay layer positioned between the first reaction layer and the second reaction layer so as to delay a first reaction between the first metal and the second metal, and containing a metal selected from the group consisting of Ti, W, Cr, Ta and an alloy thereof;

disposing the second bonding object on the first bonding object such that the first bonding metal layer and the second bonding metal layer face each other; and forming a eutectic metal bonding layer through a second reaction between the first and second bonding metal layers, the second reaction including the first reaction between the first metal and the second metal, wherein at least one of the first bonding metal layer and the second bonding metal layer includes an oxidation prevention layer disposed on an upper surface thereof, the oxidation prevention layer being formed of a metal having an oxidation reactivity lower than an oxidation reactivity of the bonding metal layer on the upper surface of which the oxidation prevention layer is disposed.

2. The method of claim 1, wherein the first bonding metal layer contains a metal selected from the group consisting of Sn, In, Zn, Bi, Pb, Ni, Au, Pt, Cu, Co, and an alloy thereof and the second bonding metal layer contains a metal selected from the group consisting of Sn, In, Zn, Bi, Pb, Ni, Au, Pt, Cu, Co, and an alloy thereof.

3. The method of claim 2, wherein:
the oxidation prevention layer is formed of a material different from a material of the bonding metal layer on the upper surface of which the oxidation prevention layer is disposed, and
the oxidation prevention layer contains a metal selected from the group consisting of Pd, Pt, Ru, Rh, Ag, Os, Ir, Au and an alloy thereof.

4. The method of claim 3, wherein the oxidation prevention layer has a thickness of about 10 Å to about 100 Å.

5. The method of claim 1, wherein the at least one of the first bonding metal layer and the second bonding metal layer includes:
a first reaction layer formed on one surface of the first or second bonding object and containing at least one metal selected from the group consisting of Ni, Pt, Au, Cu and Co, and
a second reaction layer formed on the first reaction layer, so as to react with the metal of the first reaction layer to provide a eutectic metal, and containing a metal selected from the group consisting of Sn, In, Zn, Bi, Au, Co and an alloy thereof.

6. The method of claim 5, wherein the at least one of the first bonding metal layer and the second bonding metal layer further includes a reaction delay layer positioned between the first reaction layer and the second reaction layer and containing a metal selected from the group consisting of Ti, W, Cr, Ta and an alloy thereof.

7. A method of manufacturing a semiconductor light emitting device, the method comprising:
preparing a light emitting laminate in which a first conductivity type semiconductor layer, an active layer, and a second conductivity type semiconductor layer are sequentially formed on a semiconductor growth substrate;
forming a first bonding metal layer on the light emitting laminate and forming a second bonding metal layer on a permanent substrate, such that at least one of the first bonding metal layer and the second bonding metal layer includes:
a first reaction layer formed on one surface of the light emitting laminate or the permanent substrate and containing a first metal,
a second reaction layer formed on the first reaction layer and containing a second metal for reacting with the first metal to provide a eutectic metal, and
a reaction delay layer positioned between the first reaction layer and the second reaction layer so as to delay a first reaction between the first metal and the second metal, and containing a metal selected from the group consisting of Ti, W, Cr, Ta and an alloy thereof;

disposing the light emitting laminate on the permanent substrate such that the first bonding metal layer and the second bonding metal layer come into contact with each other; and forming a eutectic metal bonding layer through a second reaction between the first bonding metal layer and the second bonding metal layer to bond the light emitting laminate and the permanent substrate to each other, the second reaction including the first reaction between the first metal and the second metal, wherein the at least one of the first bonding metal layer and the second bonding metal layer includes an oxidation prevention layer disposed on an upper surface thereof, the oxidation prevention layer being formed of a metal having an oxidation reactivity lower than an oxidation reactivity of the bonding metal layer on the upper surface of which the oxidation prevention layer is disposed.

8. The method of claim 7, further comprising: after the forming of the eutectic metal bonding layer, removing the semiconductor growth substrate from the light emitting laminate.

9. The method of claim 7, wherein:
the oxidation prevention layer is formed of a material different from a material of the bonding metal layer on the upper surface of which the oxidation prevention layer is disposed, and
the oxidation prevention layer contains a metal selected from the group consisting of Pd, Pt, Ru, Rh, Ag, Os, Ir, Au and an alloy thereof.

10. The method of claim 7, wherein the oxidation prevention layer has a thickness of about 10 Å to about 100 Å.

11. The method of claim 7, wherein the at least one of the first bonding metal layer and the second bonding metal layer includes:
a first reaction layer formed on one surface of the light emitting laminate or the permanent substrate and containing at least one metal selected from the group consisting of Ni, Pt, Au, Cu and Co, and
a second reaction layer formed on the first reaction layer, so as to react with the metal of the first reaction layer to provide a eutectic metal, and containing a metal selected from the group consisting of Sn, In, Zn, Bi, Au, Co and an alloy thereof.

12. A method of forming a metal bonding layer, the method comprising:
forming, on a surface of a first bonding object, a first bonding metal layer including:
a first reaction layer formed on one surface of the first bonding object and containing a first metal selected from the group consisting of Ni, Pt, Au, Cu and Co, a second reaction layer formed on the first reaction layer, so as to react with the first metal of the first reaction layer to provide a eutectic metal, and containing a metal selected from the group consisting of Sn, In, Zn, Bi, Au, Co and an alloy thereof, and a reaction delay layer interposed between the first and second reaction layers, so as to delay a first reaction between the first metal and the second metal and containing a metal selected from the group consisting of Ti, W, Cr, Ta and an alloy thereof;

forming, on a surface of a second bonding object, a second bonding metal layer including a first reaction layer and a second reaction layer;

disposing the second bonding object on the first bonding object such that the first bonding metal layer and the second bonding metal layer face each other; and applying heat to the first and second bonding metal layers, so as to form a eutectic metal bonding layer through a second reaction between the first and second bonding metal layers, the second reaction including the first reaction between the first metal and the second metal.

13. The method of claim 12, wherein the forming of the second bonding metal layer includes forming a further reaction delay layer between the first and second reaction layers of the second bonding metal layer so as to delay a reaction between the first and second reaction layers of the second bonding metal layer.

14. The method of claim 12, wherein at least one of the second reaction layer of the first bonding metal layer and the second reaction layer of the second bonding metal layer has a double layer structure.

15. The method of claim 12, wherein at least one of the first bonding metal layer and the second bonding metal layer includes an oxidation prevention layer disposed on an upper surface thereof.

16. The method of claim 15, wherein the oxidation prevention layer is formed of a metal having an oxidation reactivity lower than an oxidation reactivity of the bonding metal layer on the upper surface of which the oxidation prevention layer is disposed.

* * * * *